(12) United States Patent
Osumi et al.

(10) Patent No.: US 12,721,246 B2
(45) Date of Patent: Aug. 25, 2026

(54) SEMICONDUCTOR DEVICE, SEMICONDUCTOR DEVICE DESIGN METHOD, AND SEMICONDUCTOR DEVICE MANUFACTURING METHOD

(71) Applicant: ROHM CO., LTD., Kyoto (JP)

(72) Inventors: Yoshizo Osumi, Kyoto (JP); Taro Nishioka, Kyoto (JP); Tomohira Kikuchi, Kyoto (JP); Kenji Fujii, Kyoto (JP); Hiroaki Matsubara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 403 days.

(21) Appl. No.: 18/449,360

(22) Filed: Aug. 14, 2023

(65) Prior Publication Data

US 2023/0386983 A1 Nov. 30, 2023

Related U.S. Application Data

(63) Continuation of application No. PCT/JP2022/004812, filed on Feb. 8, 2022.

(30) Foreign Application Priority Data

Feb. 16, 2021 (JP) ................................ 2021-022573

(51) Int. Cl.
*H10W 90/00* (2026.01)
*H10W 70/40* (2026.01)
*H10W 74/10* (2026.01)

(52) U.S. Cl.
CPC ........ *H10W 90/811* (2026.01); *H10W 70/421* (2026.01); *H10W 74/111* (2026.01); *H10W 90/753* (2026.01); *H10W 90/755* (2026.01)

(58) Field of Classification Search
CPC ........... H01L 23/3142; H01L 23/49562; H01L 23/62; H01L 2224/48247;
(Continued)

(56) References Cited

U.S. PATENT DOCUMENTS

2014/0374890 A1* 12/2014 Yamashita .............. H01L 24/92 438/107
2016/0307854 A1* 10/2016 Matsubara .......... H10W 90/811
(Continued)

FOREIGN PATENT DOCUMENTS

| | | |
|---|---|---|
| JP | 2009-049035 | 3/2009 |
| JP | 2012-146824 | 8/2012 |
| JP | 2012-174776 | 9/2012 |
| JP | 2015-008229 | 1/2015 |
| JP | 2016-207714 | 12/2016 |

OTHER PUBLICATIONS

Written Opinion issued in International Application No. PCT/JP2022/004812, May 10, 2022, 3 pages.
(Continued)

*Primary Examiner* — Steven B Gauthier
*Assistant Examiner* — Marc-Anthony Armand
(74) *Attorney, Agent, or Firm* — HSML P.C.

(57) ABSTRACT

A semiconductor device includes first and second semiconductor elements, a conductive support, a third semiconductor element and a sealing resin. The conductive support includes first and second leads spaced apart in a first direction. The first semiconductor element is supported by the first lead. The second semiconductor element is supported by the second lead. The third semiconductor element, supported by the conductive support, insulates the first semiconductor element and the second semiconductor element. The sealing resin covers a part of the conductive support. A distance d1 between the first lead and the second lead in the first direction is greater than distance d0 given by
(Continued)

Equation below. In Equation below, Y is the number of years of insulation life (years) expected for the semiconductor device, A and B are constants determined by a material of the sealing resin, and X is a voltage (kVrms).

$$d0 = \sqrt[B]{\frac{Y}{A}} \times 0.15 \times X$$

17 Claims, 21 Drawing Sheets

(58) Field of Classification Search
CPC ...... H01L 2224/73265; H10W 72/073; H10W 72/075; H10W 72/884; H10W 74/00; H10W 74/127; H10W 70/411; H10W 70/465; H10W 70/481; H10W 42/80
See application file for complete search history.

(56) References Cited

U.S. PATENT DOCUMENTS

2018/0315686 A1* 11/2018 Takahashi ......... H01L 23/49555
2023/0085441 A1* 3/2023 Rudiak ............... H10W 20/497
257/725

OTHER PUBLICATIONS

International Search Report issued in International Application No. PCT/JP2022/004812, May 10, 2022, 2 pages.
Office Action issued in corresponding Japanese Patent Application No. 2023-500751, Dec. 2, 2025, 8 pages w/ translation.
Notice of Reasons for Refusal issued in corresponding Japanese Patent Application No. 2023-500751, Mar. 3, 2026, 6 pages w/translation.

* cited by examiner 5
121
422
12
321(32)
321a
d1
423
d3'
133
311(31)
d3
42
421
132
13
d2
13a
13b
41
411
131
311a
413
313
412
11
111
x
z 121
422
12
812a(812)
d1
423
d3'
133
811a(811)
d3
42
421
132
13
d2
13a
13b
41
411
131
413
813
412
11
111
x
z 121
422
12
423
321a
13a
42
13b
421
132
d2
13
411
131
41
133
d4
321(32)
d4'
d1
413
311(31)
311a
5
412
11
111
x
z

SEMICONDUCTOR DEVICE, SEMICONDUCTOR DEVICE DESIGN METHOD, AND SEMICONDUCTOR DEVICE MANUFACTURING METHOD

TECHNICAL FIELD

The present disclosure relates to a semiconductor device. The present disclosure also relates to a method for designing a semiconductor device and a method for manufacturing a semiconductor device.

BACKGROUND ART

Conventionally, inverter devices have been used in electric vehicles (including hybrid vehicles) and consumer electronics. In one example, an inverter device includes a semiconductor device and a switching element, such as an insulated gate bipolar transistor (IGBT) or a metal-oxide-semiconductor field-effect transistor (MOSFET). The semiconductor device includes a control element and a drive element. When the inverter device receives a control signal from an engine control unit (ECU), the control signal is inputted to the control element of the semiconductor device. The control element converts the control signal into a pulse width modulation (PWM) control signal and transmits the resulting signal to the drive element. The drive element drives a switching element with desired timing based on the PWM control signal. By driving, for example, six power semiconductors, the DC power fed from a vehicle-mounted battery is converted into three-phase AC power for driving the motor.

In the semiconductor device, the power supply voltage for the control element is a low voltage (about 5 V), whereas the power supply voltage for the drive element can be a high voltage (about 600 V or higher). An insulating element is provided as a means for signal transmission between a plurality of elements with different power supply voltages. A semiconductor device (an intelligent power module) having such an insulating element is disclosed in JP-A-2009-49035, for example. The intelligent power module disclosed in JP-A-2009-49035 includes a control circuit, an arm circuit (an upper arm or a lower arm) and an insulation transformer. The control circuit may be implemented with a CPU, a logic IC, or a system LSI having a logic IC and a CPU. The arm circuit is provided with a gate driver IC. The insulation transformer transmits a signal between the control circuit and the arm circuit in an insulated condition. The CPU of the control circuit generates a gate drive PWM signal instructing ON and OFF of the switching element, and transmits the gate drive PWM signal to the gate driver IC of the arm circuit via the insulation transformer. The gate driver IC generates a gate signal based on the PWM signal and drives the control terminal of the switching element to turn ON and OFF the switching element.

DETAILED DESCRIPTION OF EMBODIMENTS

Figure 1:
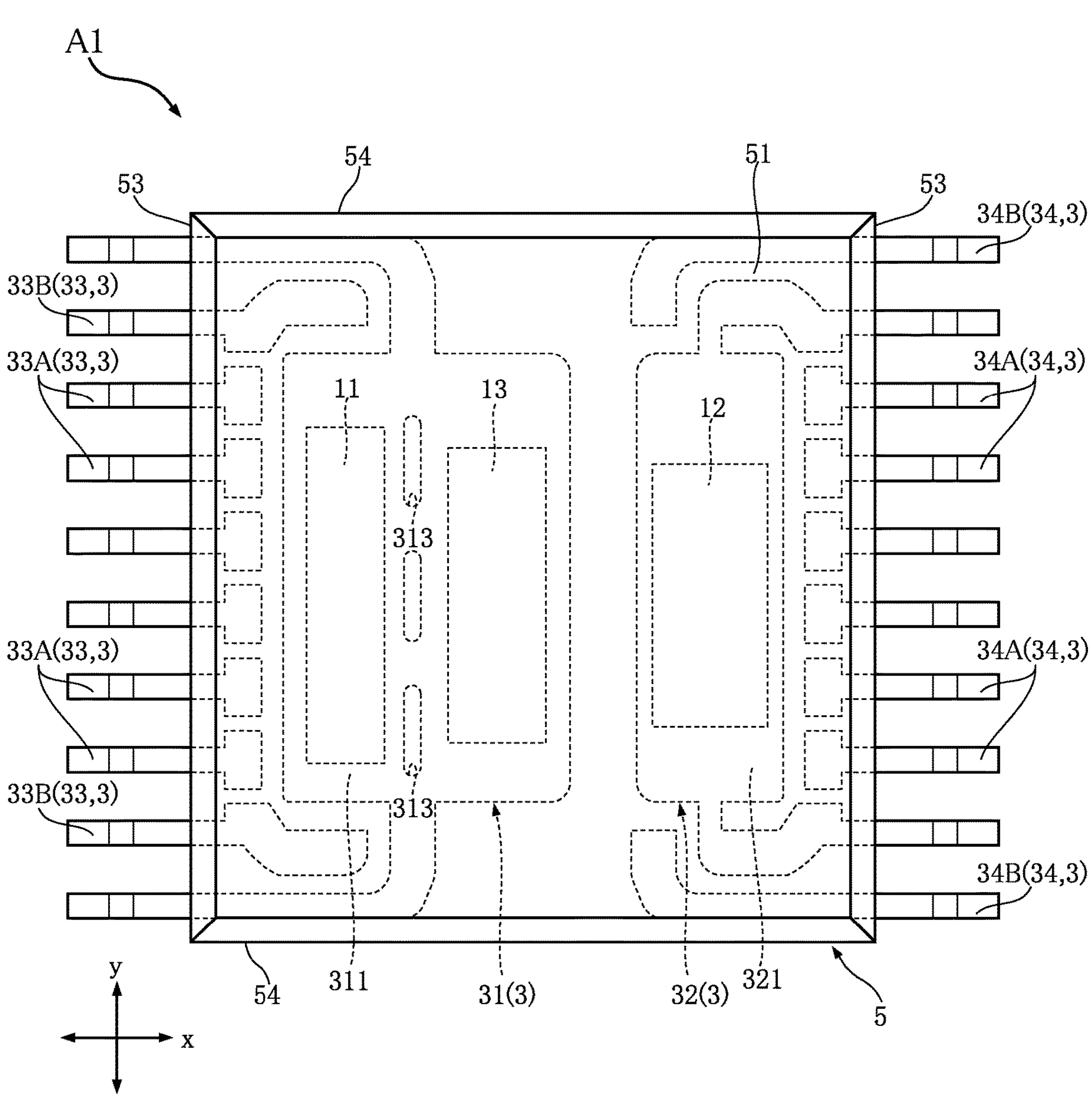
FIG. 1 is a plan view of a semiconductor device according to a first embodiment.

The following describes preferred embodiments of a semiconductor device, a method for designing a semiconductor device, and a method for manufacturing a semiconductor device of the present disclosure with reference to the drawings. In the following description, the same or similar elements are denoted by the same reference signs, and descriptions of such elements may be omitted.

FIGS. 1 to 9 show a semiconductor device A1 according to a first embodiment. As shown in the figures, the semiconductor device A1 includes a first semiconductor element 11, a second semiconductor element 12, a third semiconductor element 13, a conductive support 3, a plurality of connecting members 4 and a sealing resin 5. The conductive support 3 includes a first lead 31, a second lead 32, a plurality of third leads 33 and a plurality of fourth leads 34. The connecting members 4 include a plurality of first wires 41, a plurality of second wires 42, a plurality of third wires 43, a plurality of fourth wires 44, a plurality of fifth wires 45 and a plurality of sixth wires 46.

Figure 2:
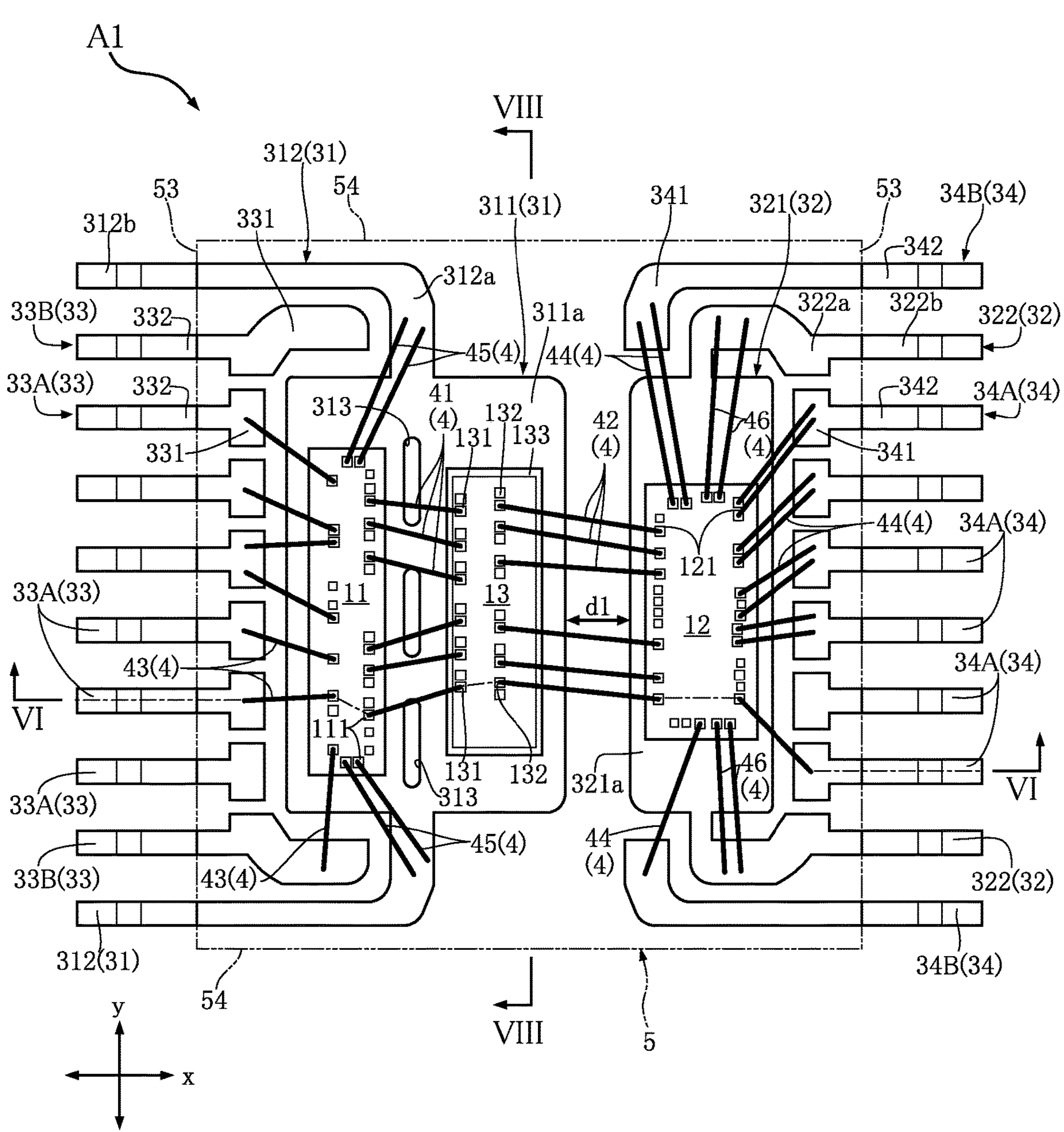
FIG. 2 is a plan view corresponding to FIG. 1, with a sealing resin indicated by imaginary lines.
Figure 3:
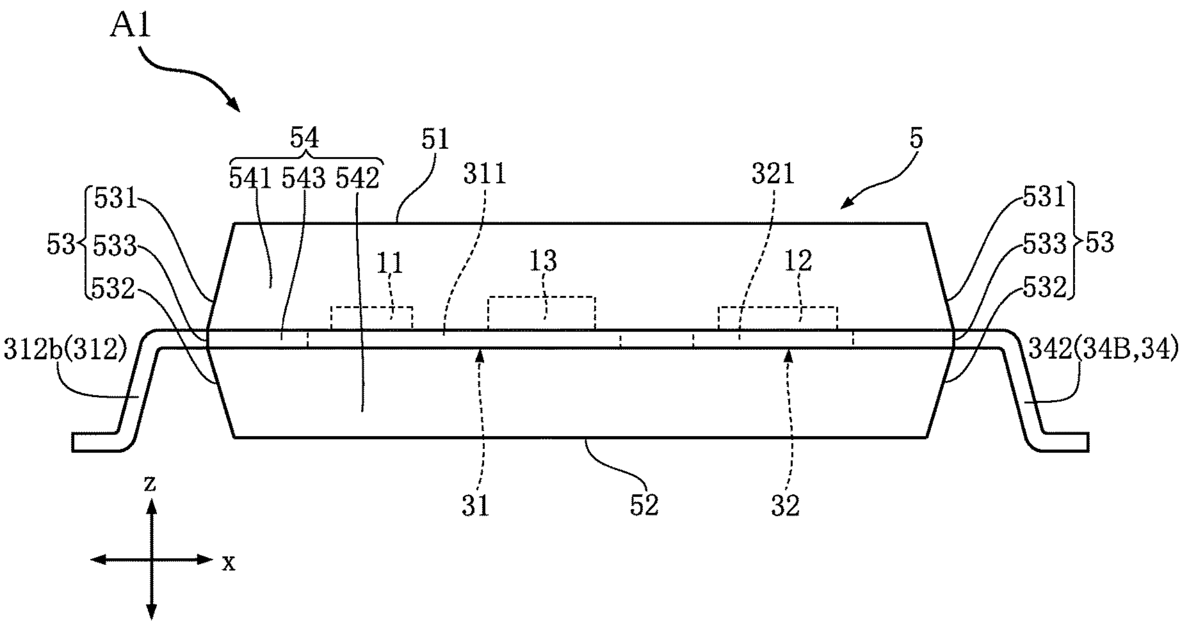
FIG. 3 is a front view of the semiconductor device according to the first embodiment.
Figure 4:
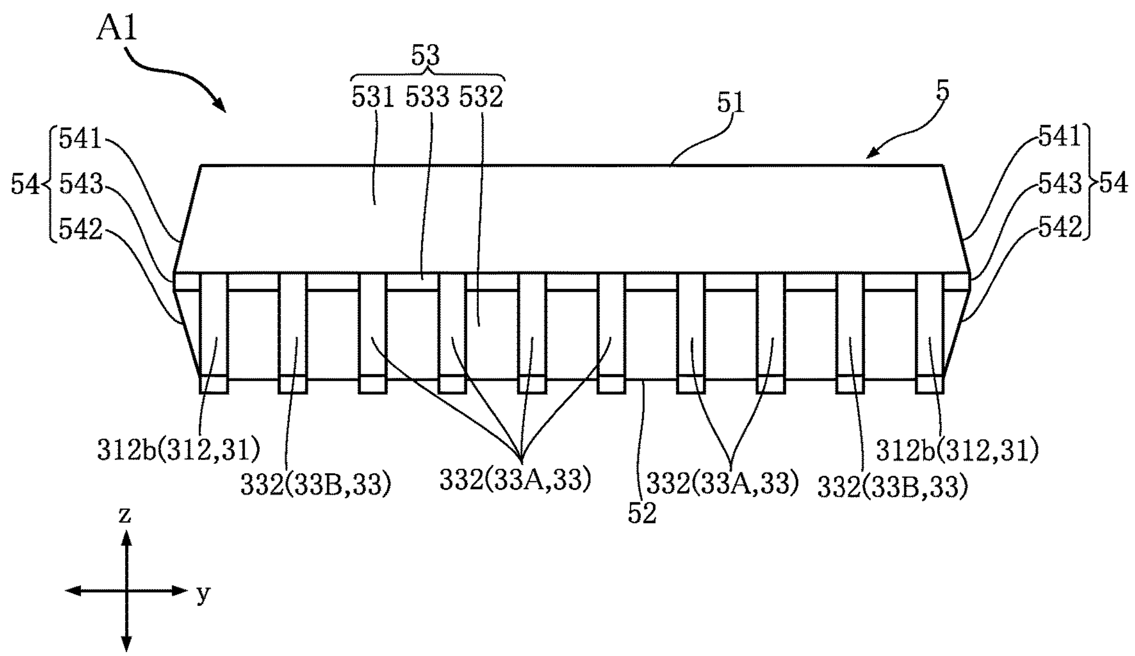
FIG. 4 is a left-side view of the semiconductor device according to the first embodiment.

FIG. 1 is a plan view of the semiconductor device A1. FIG. 2 is a plan view corresponding to FIG. 1, with the sealing resin 5 indicated by imaginary lines (dash-double dot lines). FIG. 3 is a front view of the semiconductor device A1. FIG. 4 is a left-side view of the semiconductor device A1.

Figure 5:
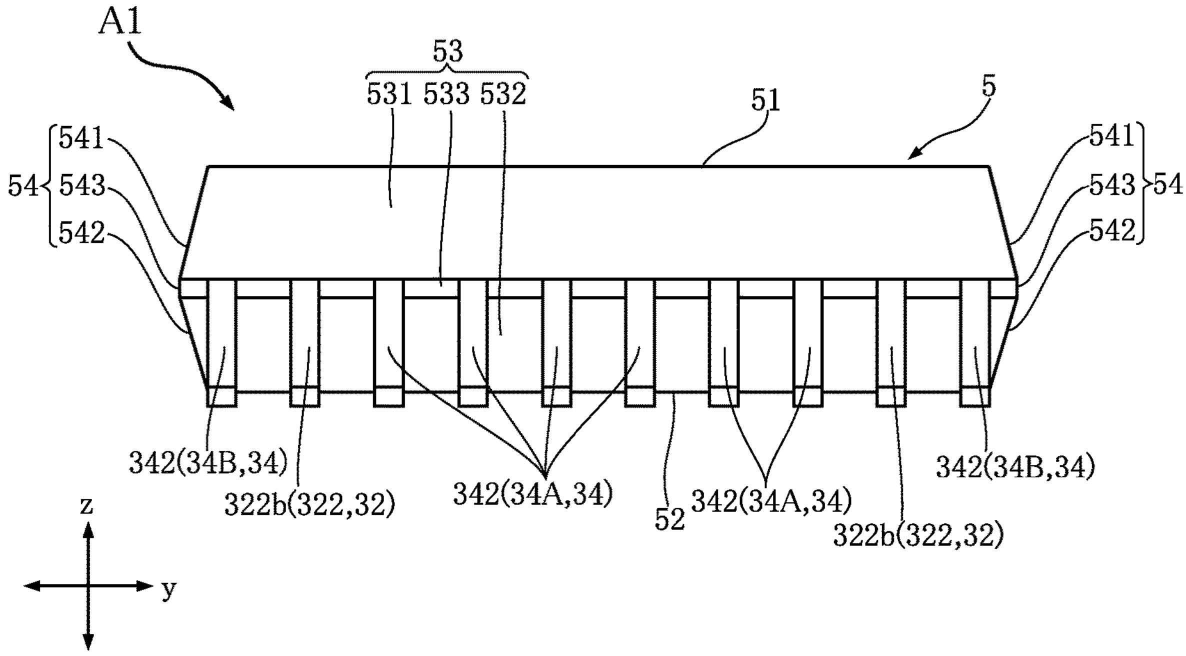
FIG. 5 is a right-side view of the semiconductor device according to the first embodiment.
Figure 6:
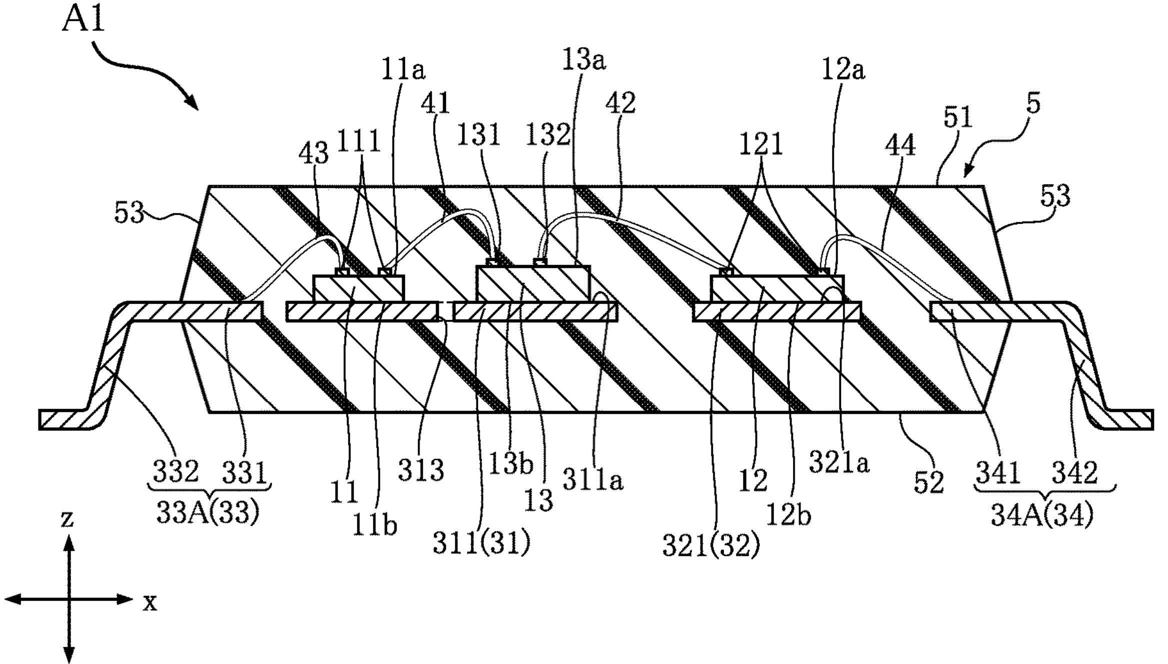
FIG. 6 is a sectional view of FIG. 2 taken along line VI-VI.
Figure 7:
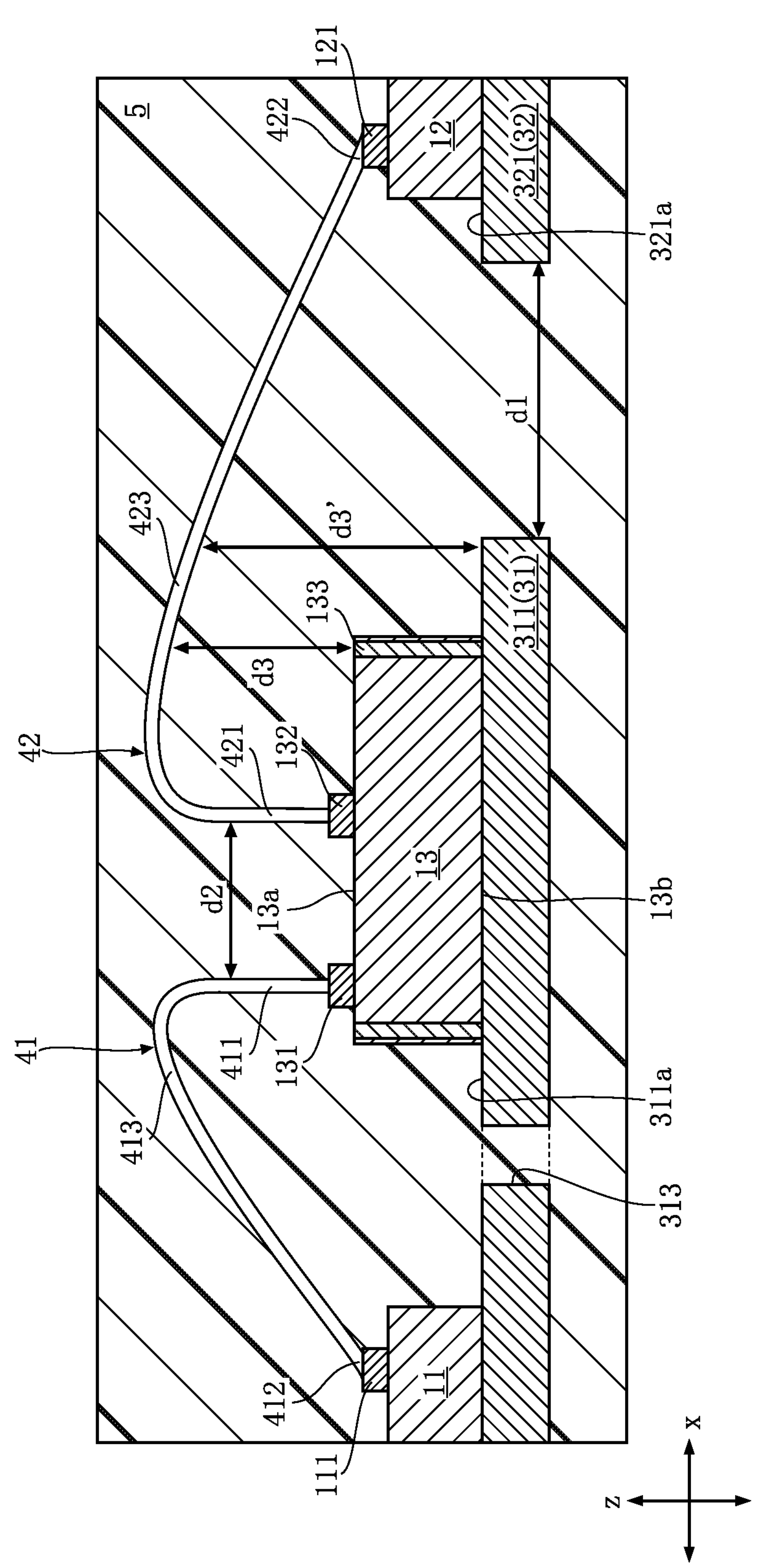
FIG. 7 is a partially enlarged sectional view in which a part of FIG. 6 is enlarged.
Figure 8:
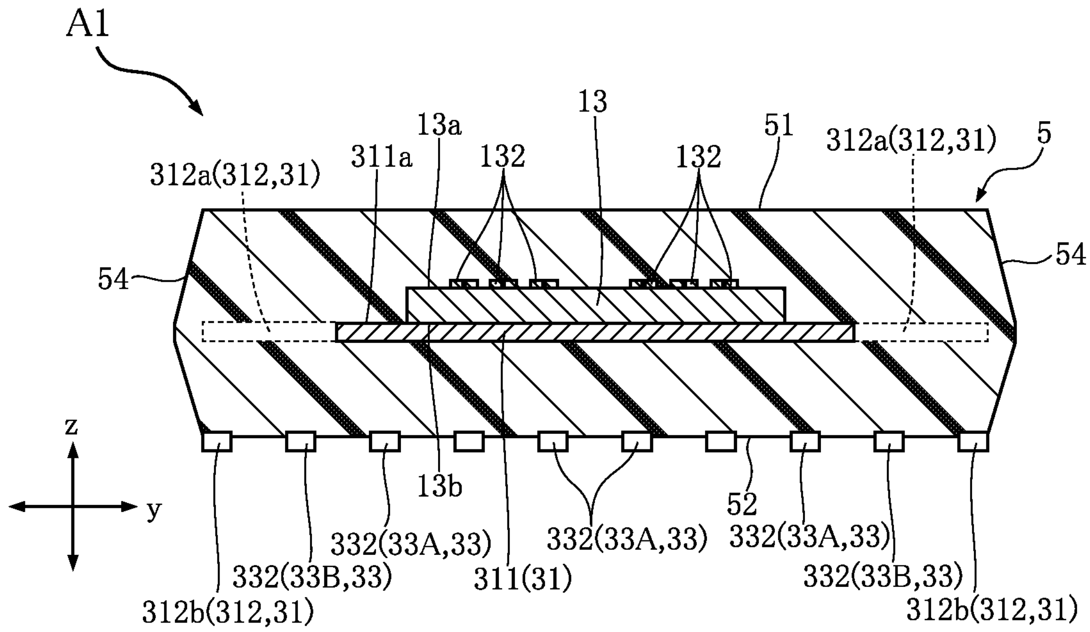
FIG. 8 is a sectional view of FIG. 2 taken along line VIII-VIII.

FIG. 5 is a right-side view of the semiconductor device A1. FIG. 6 is a sectional view of FIG. 2 taken along line VI-VI. FIG. 7 is a partially enlarged sectional view in which a part of FIG. 6 is enlarged. FIG. 8 is a sectional view of FIG. 2 taken along line VIII-VIII.

In the description of the semiconductor device A1, the thickness direction of the first semiconductor element 11, the second semiconductor element 12, the third semiconductor element 13 and the conductive support 3 is referred to as a "thickness direction z". In addition, a "plan view" of an object refers to a view of the object as seen in the thickness direction z. A direction orthogonal to the thickness direction z is referred to as a "first direction x". In the illustrated example, the first direction x is the horizontal direction in the plan views of the semiconductor device A1 (see FIG. 1). The direction orthogonal to both the thickness direction z and the first direction x is referred to as a "second direction y". In the illustrated example, the second direction y is the vertical direction in the plan views of the semiconductor device A1 (see FIG. 1).

The semiconductor device A1 is for surface mounting on the wiring board of an inverter device for electric vehicles (including hybrid vehicles), for example. The semiconductor device A1 controls the switching of switching elements, such as IGBTs or MOSFETs. As can be seen from FIGS. 1 and 3 to 5, the semiconductor device A1 is a SOP (small outline package) device, but the packaging of the semiconductor device A1 is not limited to SOP.

The first semiconductor element 11, the second semiconductor element 12 and the third semiconductor element 13 are integral to the functionality of the semiconductor device A1. The first semiconductor element 11, the second semiconductor element 12 and the third semiconductor element 13 are discrete elements. The third semiconductor element 13 is located between the first semiconductor element 11 and the second semiconductor element 12 in the first direction x. As viewed in the thickness direction z, each of the first semiconductor element 11, the second semiconductor element 12 and the third semiconductor element 13 has a rectangular shape extending in the second direction y.

The first semiconductor element 11 is a controller (a control element) of a gate driver that drives a switching element, such as an IGBT or a MOSFET. The first semiconductor element 11 includes a circuit for converting a control signal inputted from, for example, an ECU into a PWM control signal, a transmitting circuit for transmitting the PWM control signal to the third semiconductor element 13, and a receiving circuit for receiving an electrical signal from the third semiconductor element 13.

As shown in FIG. 6, the first semiconductor element 11 includes an obverse surface 11*a* and a reverse surface 11*b*. The obverse surface 11*a* and the reverse surface 11*b* are spaced apart in the thickness direction z. The obverse surface 11*a* is an upper surface of the first semiconductor element 11, and the reverse surface 11*b* is a lower surface of the first semiconductor element 11. The reverse surface 11*b* faces the first lead 31.

As shown in FIGS. 2 and 6, the first semiconductor element 11 includes a plurality of pads 111. The pads 111 are disposed on the obverse surface 11*a* (a surface facing in the same direction as a first mounting surface 311*a* of a first island part 311 of the first lead 31 described later). Each pad 111 has a composition containing aluminum (Al), for example. In other words, each pad 111 contains aluminum.

The second semiconductor element 12 is a gate driver (a driving element) that drives a switching element. The second semiconductor element 12 includes a receiving circuit for receiving a PWM control signal, a circuit for driving the switching element based on the PWM control signal, and a transmitting circuit for transmitting an electrical signal to the first semiconductor element 11. Examples of the electrical signal include an output signal of a temperature sensor disposed near the motor.

As shown in FIG. 6, the second semiconductor element 12 includes an obverse surface 12*a* and a reverse surface 12*b*. The obverse surface 12*a* and the reverse surface 12*b* are spaced apart in the thickness direction z. The obverse surface 12*a* is an upper surface of the second semiconductor element 12, and the reverse surface 12*b* is a lower surface of the second semiconductor element 12. The reverse surface 12*b* faces the second lead 32.

As shown in FIGS. 2 and 6, the second semiconductor element 12 includes a plurality of pads 121. The pads 121 are disposed on the obverse surface 12*a* (a surface facing in the same direction as a second mounting surface 321*a* of a second island part 321 of the second lead 32 described later). Each pad 121 has a composition containing aluminum, for example.

The third semiconductor element 13 is an element (an insulating element) for implementing insulated transmission of an electrical signal, such as a PWM control signal. The third semiconductor element 13 is an inductive-type insulating element. An insulation transformer is one example of the inductive-type third semiconductor element 13. An insulation transformer transmits a signal in an insulated condition by inductively coupling two inductors (a primary coil and a secondary coil). The third semiconductor element 13 includes a substrate made of silicon. On the substrate, two inductors made of copper (Cu) are disposed. The inductors include a primary coil and a secondar coil disposed one above the other in the thickness direction z. Between the primary coil and the secondary coil, a dielectric layer made of, for example, silicon dioxide ($SiO_2$) is interposed. The dielectric layer electrically insulates the primary coil and the secondar coil. The third semiconductor element 13 is not limited to the configuration described above. For example, the third semiconductor element 13 may be of a capacitive type. A capacitor is one example of the capacitive-type third semiconductor element 13. In a further example, the third semiconductor element 13 may be a photocoupler.

As shown in FIGS. 6 to 8, the third semiconductor element 13 includes an obverse surface 13*a* and a reverse surface 13*b*. The obverse surface 13*a* and the reverse surface 13*b* are spaced apart in the thickness direction z. The obverse surface 13*a* is an upper surface of the third semiconductor element 13, and the reverse surface 13*b* is a lower surface of the third semiconductor element 13. The reverse surface 13*b* faces the first lead 31.

As shown in FIGS. 2 and 6, the third semiconductor element 13 includes a plurality of pads 131 and 132. The pads 131 and 132 are disposed on the obverse surface 13*a*. Each pad 121 has a composition containing aluminum (Al), for example. The pads 131 are electrically connected to the primary coil, whereas the pads 132 are electrically connected to the secondar coil. Each of the pads 131 and 132 has a composition containing aluminum, for example. As shown in FIGS. 2 and 7, the third semiconductor element 13 includes a seal ring part 133. In plan view, the seal ring part 133 extends along the four outer edges of the third semiconductor element 13 to surround the circuit forming region. The seal ring part 133 is made of a material such as copper (Cu) or aluminum (Al).

In the semiconductor device A1, the second semiconductor element 12 requires a higher power supply voltage than the first semiconductor element 11. Consequently, a potential difference is caused between the first semiconductor element 11 and the second semiconductor element 12. The third semiconductor element 13A provides electrical insulation between a first circuit including the first semiconductor element 11 and a second circuit including the second semiconductor element 12. The components of the first circuit other than the first semiconductor element 11 include the first lead 31, the third lead 33, the first wires 41, the third wires 43 and the fifth wires 45. The components of the second circuit other than the second semiconductor element 12 include the second lead 32, the fourth leads 34, the second wires 42, the fourth wires 44 and the sixth wires 46. The first circuit and the second circuit will be held at different potentials. In the semiconductor device A1, the potential of the second circuit is higher than the potential of the first circuit. Under such conditions, the third semiconductor element 13 relays a signal transmitted between the first circuit and the second circuit. For an inverter device of an electric vehicle or a hybrid vehicle, for example, while the voltage at the ground of the first semiconductor element 11 is substantially 0 V, a transient voltage of 600 V or higher can be applied to the ground of the second semiconductor element 12. Depending on the specifications of the inverter device, the voltage applied to the ground of the second semiconductor element 12 can be 3750 V or higher.

The conductive support 3 forms conduction paths to a wiring board together with the first semiconductor element 11, the second semiconductor element 12 and the third semiconductor element 13 when the semiconductor device A1 is mounted on the wiring board. As in an example, which will be detailed later, the conductive support 3 can be formed from a single lead frame. The lead frame may be made of copper, a copper alloy or a different metal material. As described above, the conductive support 3 includes the first lead 31, the second lead 32, the third leads 33 and the fourth leads 34.

As shown in FIGS. 1 and 2, the first lead 31 and the second lead 32 are spaced apart from each other in the first direction x. In the semiconductor device A1, the first semiconductor element 11 and the third semiconductor element 13 are mounted on the first lead 31, whereas the second semiconductor element 12 is mounted on the second lead 32.

As shown in FIG. 2, the first lead 31 includes a first island part 311 and two first terminal parts 312.

The first island part 311 has a first mounting surface 311*a* facing one side in the thickness direction z (upward). The first semiconductor element 11 and the third semiconductor element 13 are bonded to the first mounting surface 311*a* via a conductive bonding material (such as solder, metal paste or sintered metal), which is not shown. The first island part 311 is covered with the sealing resin 5. In the illustrated example, the first island part 311 has a rectangular shape in plan view. In one example, the first island part 311 has a thickness of 100 μm or greater and 300 μm or less.

The first island part 311 is formed with a plurality of through-holes 313. Each through-hole 313 penetrates the first island part 311 in the thickness direction z and extends in the second direction y. In plan view, at least one of the through-holes 313 is located between the first semiconductor element 11 and the third semiconductor element 13. The through-holes 313 are aligned in the second direction y. Unlike the example shown in the figures, the first island part 311 may be formed without the through-holes 313.

As shown in FIG. 2, the two first terminal parts 312 extend out from the opposite ends of the first island part 311 in the second direction y. The two first terminal parts 312 are spaced apart from each other in the second direction y. At least one of the two first terminal parts 312 is electrically connected to the ground of the first semiconductor element 11 via one or more fifth wires 45. Each of the two first terminal parts 312 includes a covered part 312*a* and an exposed part 312*b*. The covered part 312*a* is connected to the first island part 311 and covered with the sealing resin 5. The exposed part 312*b* is connected to the covered part 312*a* and exposed from the sealing resin 5. In plan view, the exposed part 312*b* extends in the first direction x. As shown in FIG. 3, the exposed part 312*b* is bent into a gull wing profile as viewed in the second direction y. The surface of the exposed part 312*b* may be plated with tin (Sn), for example.

As shown in FIG. 2, the second lead 32 includes a second island part 321 and two second terminal parts 322.

As shown in FIG. 6, the second island part 321 has a second mounting surface 321*a* facing one side in the thickness direction z (upward). The second semiconductor element 12 is bonded to the second mounting surface 321*a* via a conductive bonding material (such as solder, metal paste or sintered metal), which is not shown. The second island part 321 is covered with the sealing resin 5. In the illustrated example, the second island part 321 has a rectangular shape in plan view. Similarly to the first island part 311, the second island part 321 has a thickness of 100 μm or greater and 300 μm or less, for example.

As shown in FIG. 2, the two second terminal parts 322 extend out from the opposite ends of the second island part 321 in the second direction y. The two second terminal parts 322 are spaced apart from each other in the second direction y. At least one of the two second terminal parts 322 is electrically connected to the ground of the second semiconductor element 12 via one or more sixth wires 46. Each of the two second terminal parts 322 includes a covered part 322*a* and an exposed part 322*b*. The covered part 322*a* is connected to the second island part 321 and covered with the sealing resin 5. The exposed part 322*b* is connected to the covered part 322*a* and exposed from the sealing resin 5. In plan view, the exposed part 322*b* extends in the first direction x. As can be seen from FIGS. 2, 3 and 5, the exposed part 322*b* is bent into a gull-wing profile as viewed in the second direction y. The surface of the exposed part 322*b* may be plated with tin, for example.

As shown in FIGS. 1 and 2, the third leads 33 are located on the side opposite the second island part 321 of the second lead 32 with respect to the first island part 311 of the first lead 31 in the first direction x. The third leads 33 are arranged side by side in the second direction y. At least one of the third leads 33 is electrically connected to the first semiconductor element 11 via one or more third wires 43. The third leads 33 include a plurality of inner leads 33A and two outer leads 33B. Each of the two outer leads 33B is located between one of the two first terminal parts 312 of the first lead 31 and the inner lead 33A that is nearest to the first terminal part 312 in the second direction y.

As shown in FIGS. 2 and 6, each of the third leads 33 (the inner leads 33A and the two outer leads 33B) includes a covered part 331 and an exposed part 332. The covered part 331 is covered with the sealing resin 5. The length of the covered part 331 of each outer lead 33B in the first direction x is greater than the length of the covered part 331 of each inner lead 33A in the first direction x. As shown in FIGS. 2 and 6, the exposed part 332 is connected to the covered part 331 and exposed from the sealing resin 5. In plan view, the exposed part 332 extends in the first direction x. As viewed in the second direction y, the exposed part 332 is bent into a gull wing profile. The exposed part 332 has a shape identical to the shape of the exposed part 312*b* of each first terminal part 312 of the first lead 31. The surface of the exposed part 332 may be plated with tin, for example.

As shown in FIGS. 1 and 2, the fourth leads 34 are located on the side opposite the third leads 33 with respect to the first island part 311 of the first lead 31 in the first direction x. The fourth leads 34 are arranged side by side in the second direction y. At least one of the fourth leads 34 is electrically connected to the second semiconductor element 12 via one or more fourth wires 44. The fourth leads 34 include a plurality of inner leads 34A and two outer leads 34B. The two outer leads 34B are located on the opposite sides of the inner leads 34A in the second direction y. Each second terminal part 322 of the second lead 32 is located between one of the outer leads 34B and the inner lead 34A that is nearest to the outer lead 34B in the second direction y.

As shown in FIGS. 2 and 6, each of the fourth leads 34 (the inner leads 34A and the two outer leads 34B) includes a covered part 341 and an exposed part 342. The covered part 341 is covered with the sealing resin 5. The length of the covered part 341 of each outer lead 34B in the first direction x is greater than the length of the covered part 341 of each inner lead 34A in the first direction x. As shown in FIGS. 2 and 6, the exposed part 342 is connected to the covered part 341 and exposed from the sealing resin 5. In plan view, the exposed part 342 extends in the first direction x. As shown in FIG. 3, the exposed part 342 is bent into a gull wing profile as viewed in the second direction y. The exposed part 342 has a shape identical to the shape of the exposed part 322*b* of each second terminal part 322 of the second lead 32. The surface of the exposed part 342 may be plated with tin, for example.

Each connecting member 4 electrically connects two isolated parts. As described above, the connecting members 4 include the first wires 41, the second wires 42, the third wires 43, the fourth wires 44, the fifth wires 45 and the sixth wires 46.

The first wires 41, the second wires 42, the third wires 43, the fourth wires 44, the fifth wires 45 and the sixth wires 46 are each made of a metal material, examples of which include gold, copper, and aluminum. Alternatively, bonding ribbons or sheets of metal may be used as the connecting members 4, instead of the first wires 41, the second wires 42, the third wires 43, the fourth wires 44, the fifth wires and the sixth wires 46.

As shown in FIG. 2, each first wire 41 is bonded to a pad 111 of the first semiconductor element 11 and a pad 131 of the third semiconductor element 13. Each first wire 41 electrically connects the first semiconductor element 11 and the third semiconductor element 13. The first wires 41 are arranged side by side in the second direction y.

As shown in FIG. 7, each first wire 41 includes a neck part 411, a bonded part 412 and a loop part 413. The neck part 411 of each first wire 41 is bonded to a pad 131 and extends therefrom in the thickness direction z. The bonded part 412 is bonded to a pad 111. The loop part 413 is connected to the neck part 411 and the bonded part 412. The loop part 413 extends in a curve from the neck part 411 to the bonded part 412.

As shown in FIG. 2, each second wire 42 is bonded to a pad 121 of the second semiconductor element 12 and a pad 132 of the third semiconductor element 13. Each second wire 42 electrically connects the second semiconductor element 12 and the third semiconductor element 13. The second wires 42 are arranged side by side in the second direction y. Each second wire 42 extends across a gap between the first island part 311 of the first lead 31 and the second island part 321 of the second lead 32.

As shown in FIG. 7, each second wire 42 includes a neck part 421, a bonded part 422 and a loop part 423. The neck part 421 of each second wire 42 is bonded to a pad 132 and extends therefrom in the thickness direction z. The bonded part 422 is bonded to a pad 121. The loop part 423 is connected to the neck part 421 and the bonded part 422. The loop part 423 extends in a curve from the neck part 421 to the bonded part 422.

As shown in FIG. 2, each third wire 43 is bonded to a pad 111 of the first semiconductor element 11 and the covered part 331 of a third lead 33. Each third wire 43 electrically connects the first semiconductor element 11 and a third lead 33.

As shown in FIG. 2, each fourth wire 44 is bonded to a pad 121 of the second semiconductor element 12 and the covered part 341 of a fourth lead 34. Each fourth wire 44 electrically connects the second semiconductor element 12 and a fourth lead 34.

As shown in FIG. 2, each fifth wire 45 is bonded to a pad 111 of the first semiconductor element 11 and the covered part 312*a* of one of the two first terminal parts 312. Each fifth wire 45 electrically connects the first semiconductor element 11 and the first lead 31.

As shown in FIG. 2, each sixth wire 46 is bonded to a pad 121 of the second semiconductor element 12 and the covered part 322*a* of one of the two second terminal parts 322. Each sixth wire 46 electrically connects the second semiconductor element 12 and the second lead 32.

As shown in FIG. 1, the sealing resin 5 covers the first semiconductor element 11, the second semiconductor element 12, the third semiconductor element 13, a part of the conductive support 3 and the connecting member 4. The sealing resin 5 has an electrically insulating property. The sealing resin insulates the components of the first circuit (e.g., the first lead 31) and the components of the second circuit (e.g., the second lead 32) from each other. The sealing resin 5 is made of a material containing black epoxy resin, for example.

In the illustrated example, the sealing resin 5 has a rectangular shape in plan view.

As shown in FIGS. 2 to 5, the sealing resin 5 has a top surface 51, a bottom surface 52, a pair of first side surfaces 53 and a pair of second side surfaces 54.

As shown in FIGS. 3 to 5, the top surface 51 and the bottom surface 52 are spaced apart from each other in the thickness direction z. The top surface 51 and the bottom surface 52 face away from each other in the thickness direction z. Each of the top surface 51 and the bottom surface 52 is flat (or substantially flat).

As shown in FIGS. 3 to 5, the first side surfaces 53 are connected to the top surface 51 and the bottom surface 52 and spaced apart from each other in the first direction x. From the first side surface 53 located on one side in the first direction x, the exposed parts 312*b* of the two first terminal parts 312 (the first lead 31) and the exposed parts 332 of the third leads 33 protrude. From the first side surface 53 located on the other side in the first direction x, the exposed parts 322*b* of the two second terminal parts 322 (the second lead 32) and the exposed parts 342 of the fourth leads 34 protrude.

As shown in FIGS. 3 to 5, each first side surface 53 includes a first upper part 531, a first lower part 532 and a first middle part 533. The first upper part 531 has one end in the thickness direction z connected to the top surface 51 and the other end to the first middle part 533. The first upper part 531 is inclined relative to the top surface 51.

The first lower part 532 has one end in the thickness direction z connected to the bottom surface 52 and the other end to the first middle part 533. The first lower part 532 is inclined relative to the bottom surface 52. The first middle part 533 has one end in the thickness direction z connected to the first upper part 531 and the other end to the first lower part 532. The first middle part 533 has the in-plane direction parallel to the thickness direction z and the second direction y. In plan view, the first middle part 533 is located outside the top surface 51 and the bottom surface 52. From the first middle parts 533 of the first side surfaces 53, the respective exposed parts protrude, namely the exposed parts 312*b* of the two first terminal part 312 (the first lead 31) and the exposed parts 322*b* of the two second terminal parts 322 (the second lead 32), the exposed parts 332 of the third lead 33 and the exposed parts 342 of the fourth lead 34.

As shown in FIGS. 3 to 5, the second side surfaces 54 are connected to the top surface 51 and the bottom surface 52 and spaced apart from each other in the second direction y. As shown in FIG. 1, the first lead 31, the second lead 32, the third leads 33 and the fourth leads 34 are located away from the second side surface 54.

As shown in FIGS. 3 to 5, each second side surface 54 includes a second upper part 541, a second lower part 542 and a second middle part 543. The second upper part 541 has one end in the thickness direction z connected to the top surface 51 and the other end to the second middle part 543. The second upper part 541 is inclined relative to the top surface 51. The second lower part 542 has one end in the thickness direction z connected to the bottom surface 52 and the other end to the second middle part 543. The second lower part 542 is inclined relative to the bottom surface 52. The second middle part 543 has one end in the thickness direction z connected to the second upper part 541 and the other end to the second lower part 542. The second middle part 543 has the in-plane direction parallel to the thickness direction z and the first direction x. In plan view, the second middle part 543 is located outside the top surface 51 and the bottom surface 52.

Generally, the motor driver circuit of an inverter device includes a half-bridge circuit including a low-side (low-voltage side) switching element and a high-side (high-voltage side) switching element. The following description is directed to an example in which the switching elements are MOSFETs. In such an example, the source of the low-side switching element and the gate driver that drives the low-side switching element both have the reference potential at the ground. In contrast, the source of the high-side switching element and the gate driver that drives the high-side switching element both have the reference potential corresponding to the potential at the output node of the half-bridge circuit. The potential at the output node varies in response to the switching of the high-side switching element and the low-side switching element, so that the reference potential of the gate driver for the high-side switching element varies as well. During the time the high-side switching element is ON, the reference potential is equal to the voltage applied to the drain of the high-side switching element (e.g., about 600 V or higher). In the semiconductor device A1, the ground of the first semiconductor element 11 and the ground of the second semiconductor element 12 are isolated from each other. Thus, when the semiconductor device A1 is used as a gate driver for driving a high-side switching element, the ground of the second semiconductor element 12 can be subjected to a transient voltage as high as the voltage applied to the drain of the high-side switching element.

In the semiconductor device A1, the components of the first circuit and the components of the second circuit are separated at least by a distance d0 (mm) that is given by Equation (1) below. In Equation (1), Y is the number of years of insulation life (years) expected for the semiconductor device A1, A and B are constants determined by the material of the sealing resin 5, and X is the voltage (kVrms) (effective value) used in the semiconductor device A1. The voltage X is the difference between the voltage applied to the first circuit and the voltage applied to the second circuit. Because the semiconductor device A1 generates alternating current voltage by driving the switching elements, the voltage X is specified by the effective value. For the sealing resin 5 made of epoxy resin, the constant A is $1000\times4^{16}$ and the constant B is 16. In addition, 0.15 is an offset value for calculating the distance d0. As can be seen from Equation (1), the distance d0 increases as the voltage increases and also as the insulation life increases, and varies depending on the material of the sealing resin 5. Suppose, for example, that the length of insulation life Y is (years), the voltage X is 1 (kVrms), and the constant A is $1000\times4^{16}$, which is for epoxy resin, then the distance d0 given by Equation (1) is calculated to be about 0.0294 mm (=29.4 μm). The present disclosure also includes an embodiment in which the distance d0 is calculated by using the voltage X (kVrms) as the only variable and the other parameters (A, B and Y) as constants. Given the values mentioned above as the respective parameters, the distance d0 (mm) can then be calculated by using the equation: d0=0.0294×X, instead of using Equation (1).

$$d0 = \sqrt[B]{\frac{Y}{A}} \times 0.15 \times X \tag{1}$$

Specifically, a distance d1 between the first lead 31 and the second lead 32 in the first direction x (see FIG. 7) is greater than the distance d0 given above. In the example shown in FIG. 7, the distance d1 is a distance between the first island part 311 and the second island part 321 measured where they are nearest to each other. The distance d1 may be 10 mm or less, for example. This can avoid increasing the size of the semiconductor device A1. In the semiconductor device A1, the distance d1 is about 300 μm and hence greater than the distance d0 (≈29.4 μm) of the above example.

In addition, a distance d2 between the first wire 41 and the second wire 42 (see FIG. 7) is greater than the distance d0 given above. In the example shown in the figure, the distance d2 is a distance between the neck part 411 and the neck part 421 measured where they are nearest to each other. The distance d2 may be 10 mm or less, for example. This can avoid increasing the size of the semiconductor device A1. In the semiconductor device A1, the distance d2 is about 300 μm and hence greater than the distance d0 (≈29.4 μm) of the above example.

In addition, a distance d3 between each second wire 42 and the third semiconductor element 13 (see FIG. 7) is greater than the distance d0 given above. In the example shown in FIG. 7, the distance d3 is a distance in the thickness direction z between the loop part 423 and the seal ring part 133 of the third semiconductor element 13 measured where they are nearest to each other. The distance d3 may be 10 mm or less, for example. This can avoid increasing the size of the semiconductor device A1. In the semiconductor device A1, the distance d3 is about 170 μm and hence greater than the distance d0 (≈29.4 μm) of the above example.

In addition, a distance d3' between each second wire 42 and the first lead 31 (see FIG. 7) is greater than the distance d0 given above. In the example shown in FIG. 7, the distance d3' is a distance in the thickness direction z between the loop part 423 and the first mounting surface 311*a* of the first island part 311 measured where they are nearest to each other. The distance d3' may be 10 mm or less, for example. This can avoid increasing the size of the semiconductor device A1. In semiconductor device A1, the distance d3' is about 470 μm and hence greater than the distance d0 (≈29.4 μm) of the above example.

Figure 9:
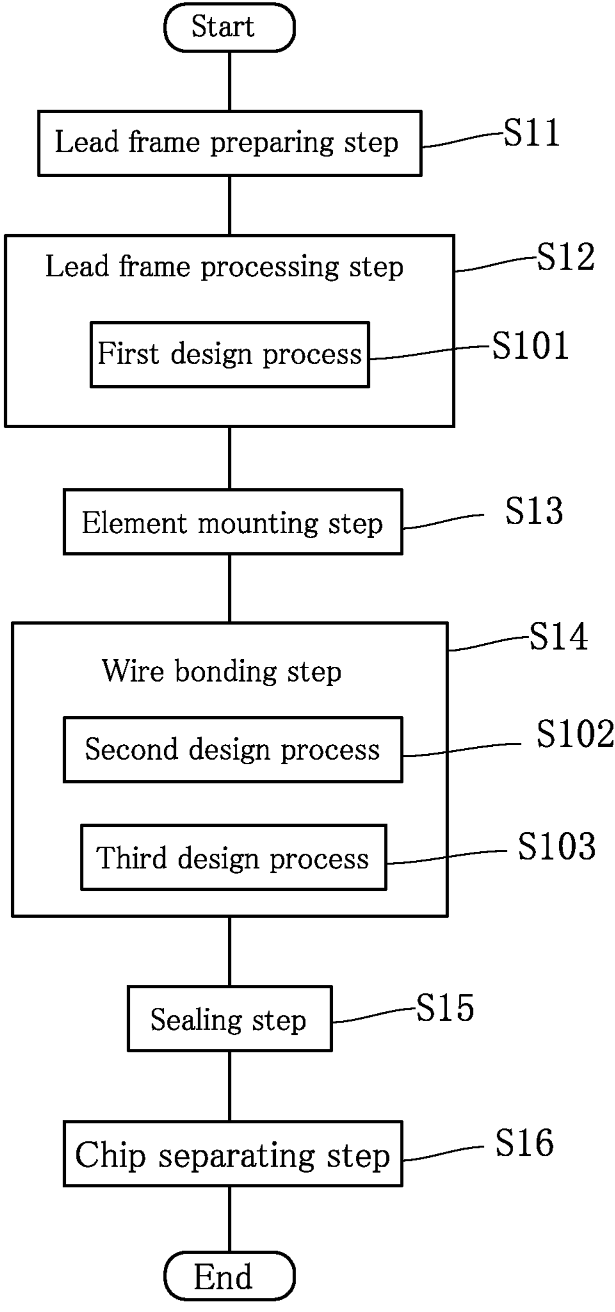
FIG. 9 is a flowchart of an example of a method for manufacturing a semiconductor device according to the first embodiment.
Figure 15:
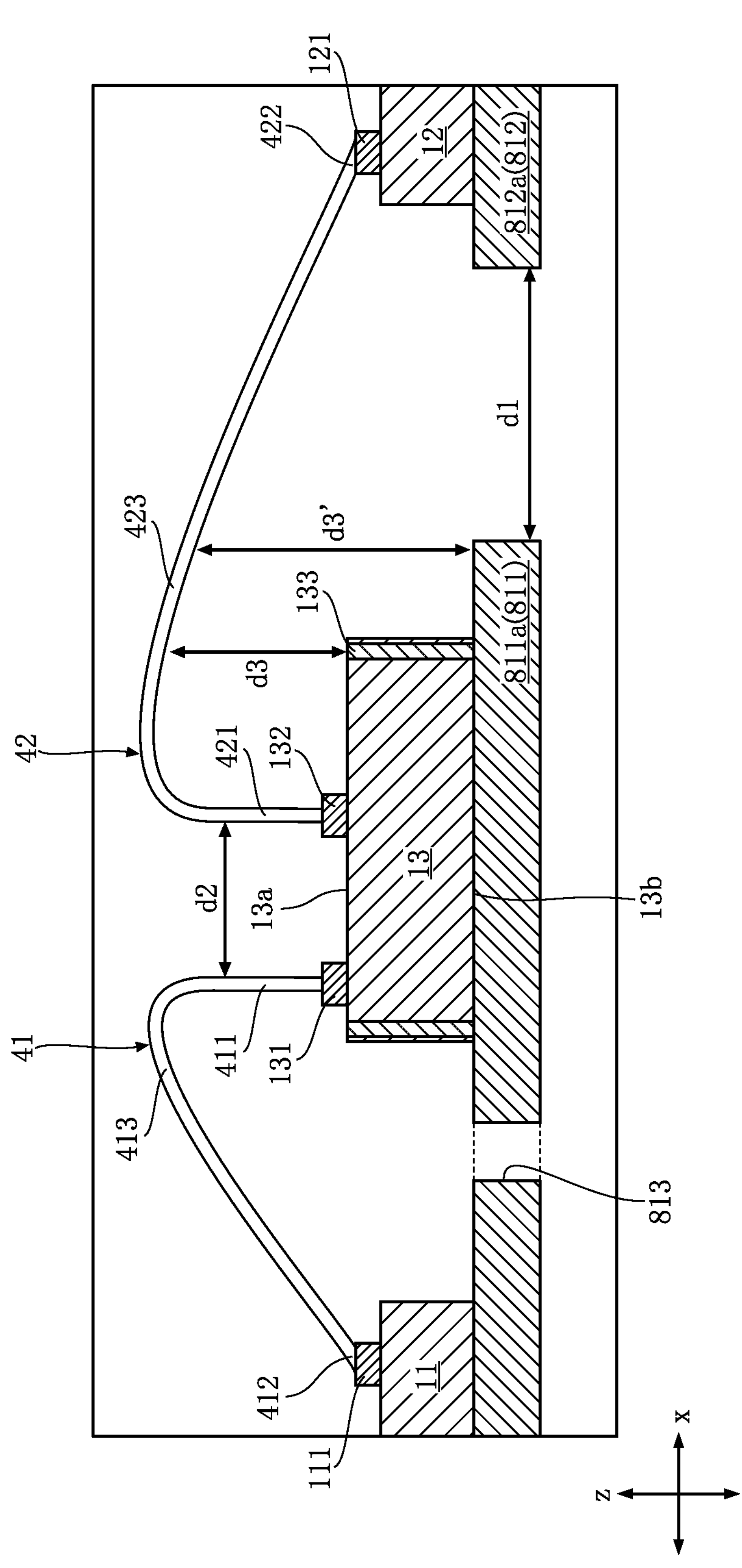
FIG. 15 is a sectional view for illustrating a step of the method shown in FIG. 9.

Next, the following describes an example of a method for manufacturing the semiconductor device A1 with reference to FIGS. 9 and 15. FIG. 9 is a flowchart of an example of a method for manufacturing the semiconductor device A1. FIGS. to 14 are plan views illustrating steps of the method for manufacturing the semiconductor device A1. FIG. 15 is a sectional view illustrating a step of the method for manufacturing the semiconductor device A1. FIG. 15 shows a section taken along the same line as the section shown in FIG. 7.

As shown in FIG. 9, the method for manufacturing the semiconductor device A1 according to the present embodiment includes a lead frame preparing step S11, a lead frame processing step S12, an element mounting step S13, a wire bonding step S14, a sealing step S15 and a chip separating step S16. The method for manufacturing the semiconductor device A1 includes a design method having a design step. The design step includes a first design process S101, a second design process S102 and a third design process S103, all of which will be detailed later.

Figure 10:
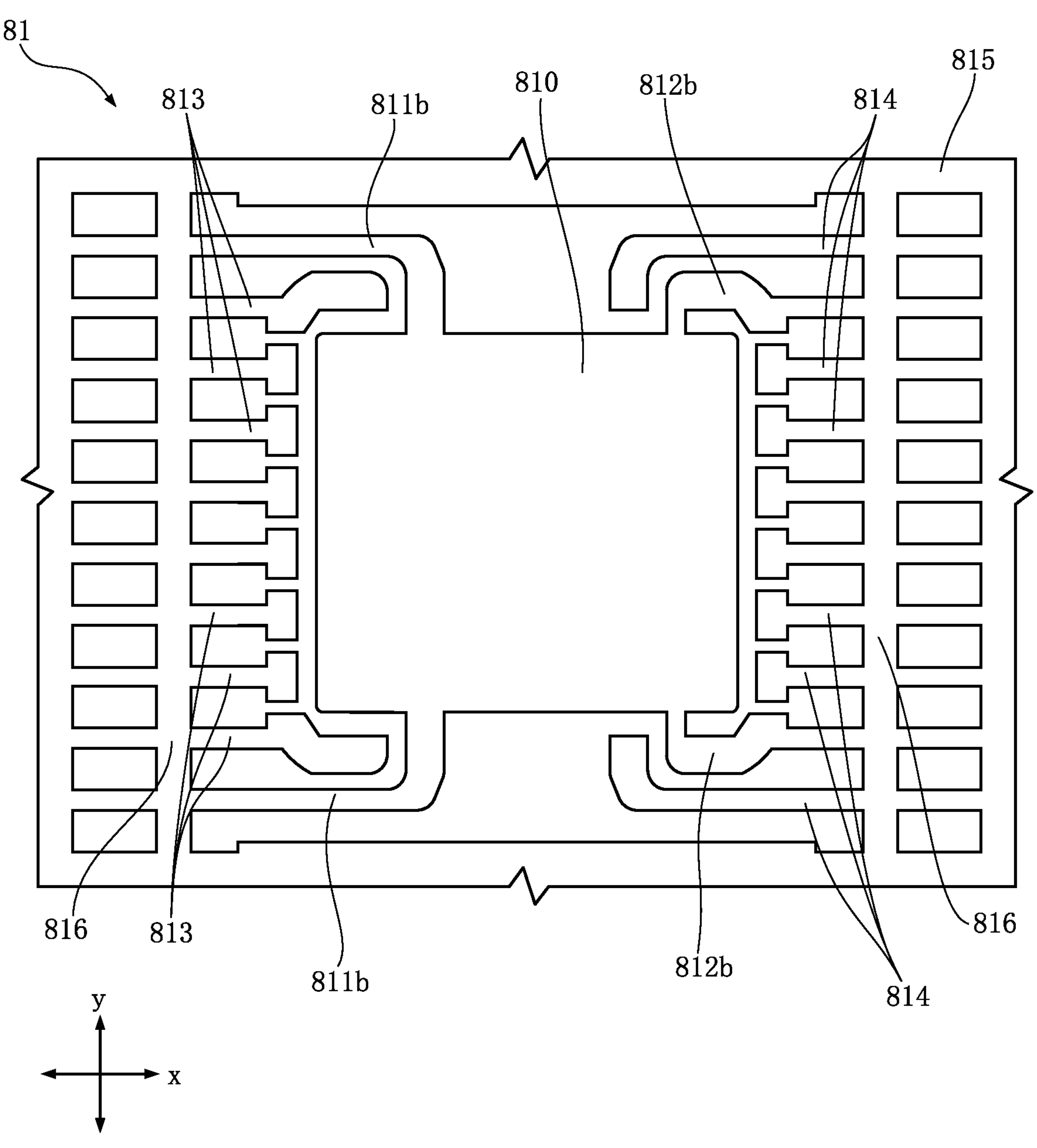
FIG. 10 is a plan view for illustrating a step of the method shown in FIG. 9.

In the lead frame preparing step S11, a lead frame 81 shown in FIG. 10 is prepared. As shown in FIG. 10, the lead frame 81 includes a flat plate 810, a plurality of support leads 811*b* and 812*b*, a plurality of leads 813 and 814, an outer frame 815 and a plurality of dam bars 816. The lead frame 81 can be formed by punching of a copper plate having a rectangular shape in in plan view. As shown in FIG. 10, the support leads 811*b* and 812*b* are connected to the flat plate 810. In addition, the support leads 811*b* and 812*b* and the leads 813 and 814 are connected together by the outer frame 815 and the dam bars 816. Note that the outer frame 815 and the dam bars 816 of the lead frame 81 do not form parts of the semiconductor device A1.

Figure 11:
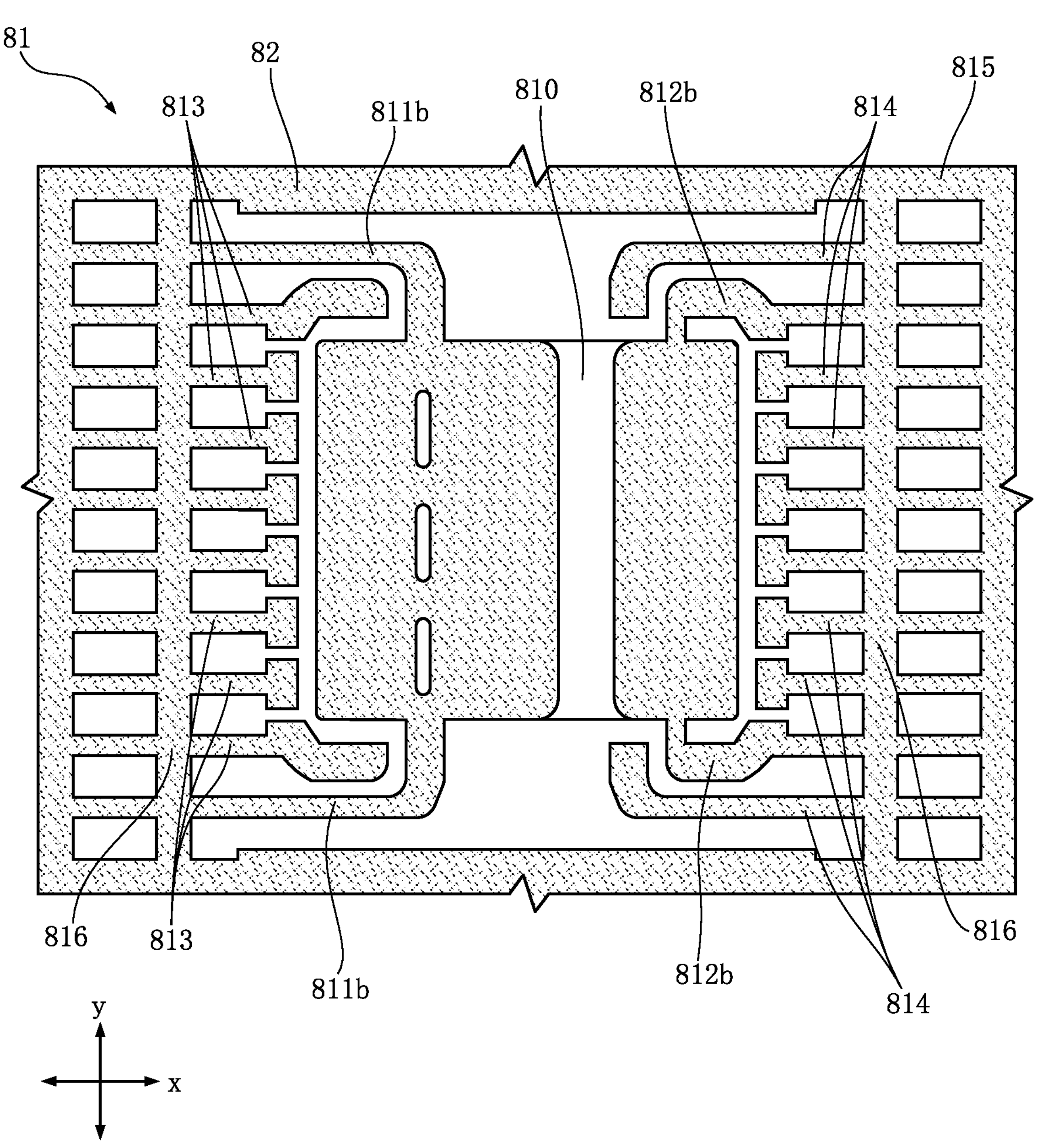
FIG. 11 is a plan view for illustrating a step of the method shown in FIG. 9.
Figure 12:
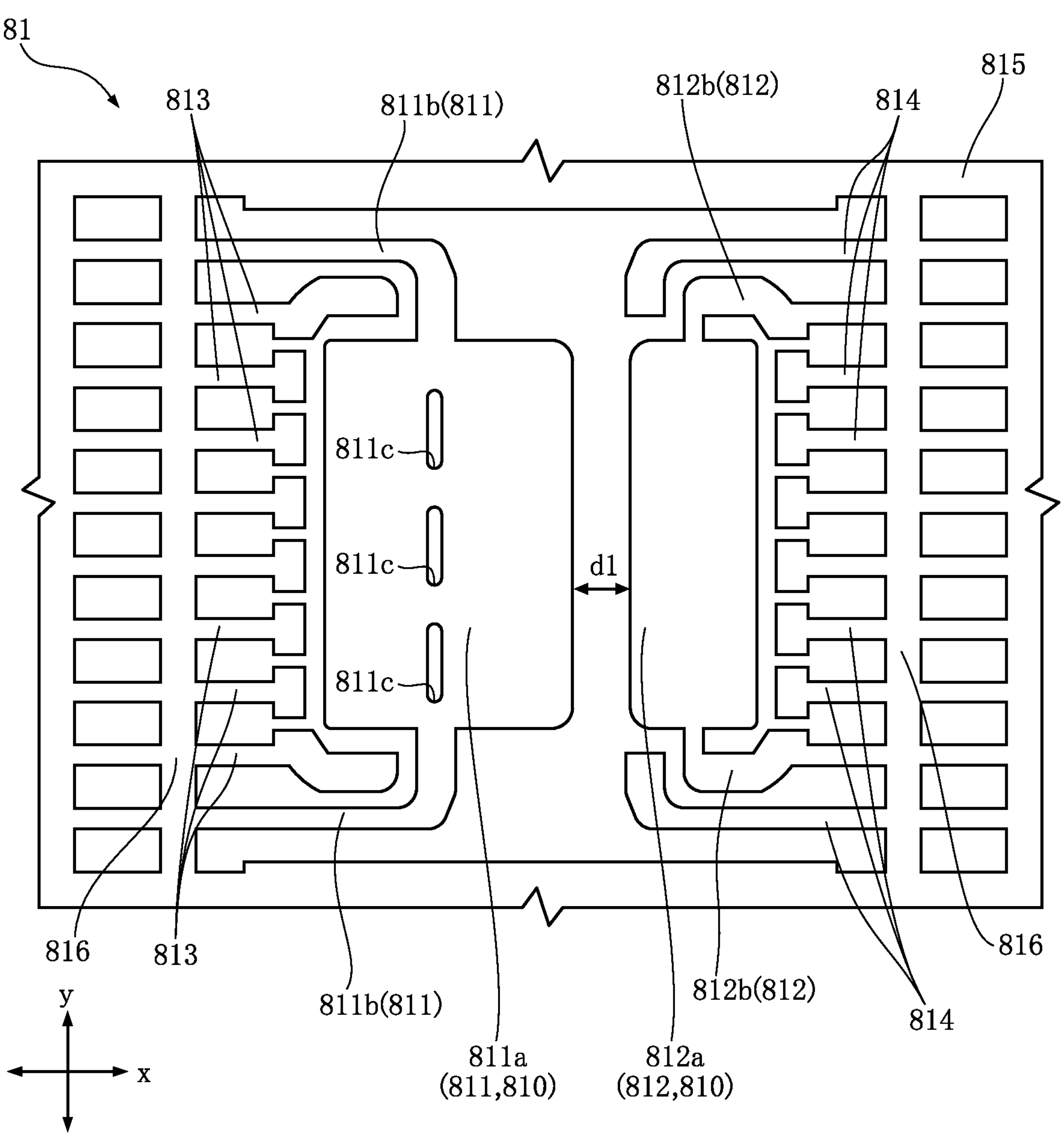
FIG. 12 is a plan view for illustrating a step of the method shown in FIG. 9.

Next, in the lead frame processing step S12, the flat plate 810 of the lead frame 81 is divided into a first island 811*a* and a second island 812*a* (see FIG. 12). In the present embodiment, the lead frame processing step S12 also includes forming a plurality of through-holes 811*c* in the flat plate 810, in addition to dividing the flat plate 810 into the first island 811*a* and the second island 812*a*. Specifically, the lead frame processing step S12 begins with applying a resist 82 to the lead frame 81 as shown in FIG. 11. In FIG. 11, the resist 82 is shaded with dots. Then, the lead frame 81 masked with the resist 82 is etched. The etching removes the portions of the lead frame 81 exposed from the resist 82, dividing the flat plate 810 into the first island 811*a* and the second island 812*a* and also forming the through-holes 811*c* in the flat plate 810 (the first island 811*a*). Then, the resist 82 is removed to provide the lead frame 81 as shown in FIG. 12. In the lead frame 81 shown in FIG. 12, the support leads 811*b* are connected to the first island 811*a*, where the first island 811*a* and the support leads 811*b* together form a first lead 811. In addition, the support leads 812*b* are connected to the second island 812*a*, where the second island 812*a* and the support leads 812*b* together form a second lead 812.

In the present embodiment, the lead frame processing step S12 includes the first design process S101 as shown in FIG. 9.

The first design process S101 determines the design of the first island 811*a* and the second island 812*a* to be divided from the flat plate 810, ensuring that the distance d1 between the first island 811*a* (the first lead 811) and the second island 812*a* (the second lead 812) in the first direction x (see FIGS. 12 and 15) is greater than the distance d0. The distance d0 is given by Equation (1) above. As will be understood from the details given below, the first island 811*a* (the first lead 811) corresponds to the first island part 311 (the first lead 31), and the second island 812*a* (the second lead 812) corresponds to the second island part 321 (the second lead 32). Hence, the distance d1 that is determined to be greater than the distance d0 by the first design process S101 is the distance d1 between the first lead 31 and the second lead 32 in the first direction x. Preferably, the first design process S101 determines the distance d1 to be greater than the distance d0 without exceeding, for example, 10 mm, for avoiding an increase in size of the semiconductor device A1 to be manufactured.

Figure 13:
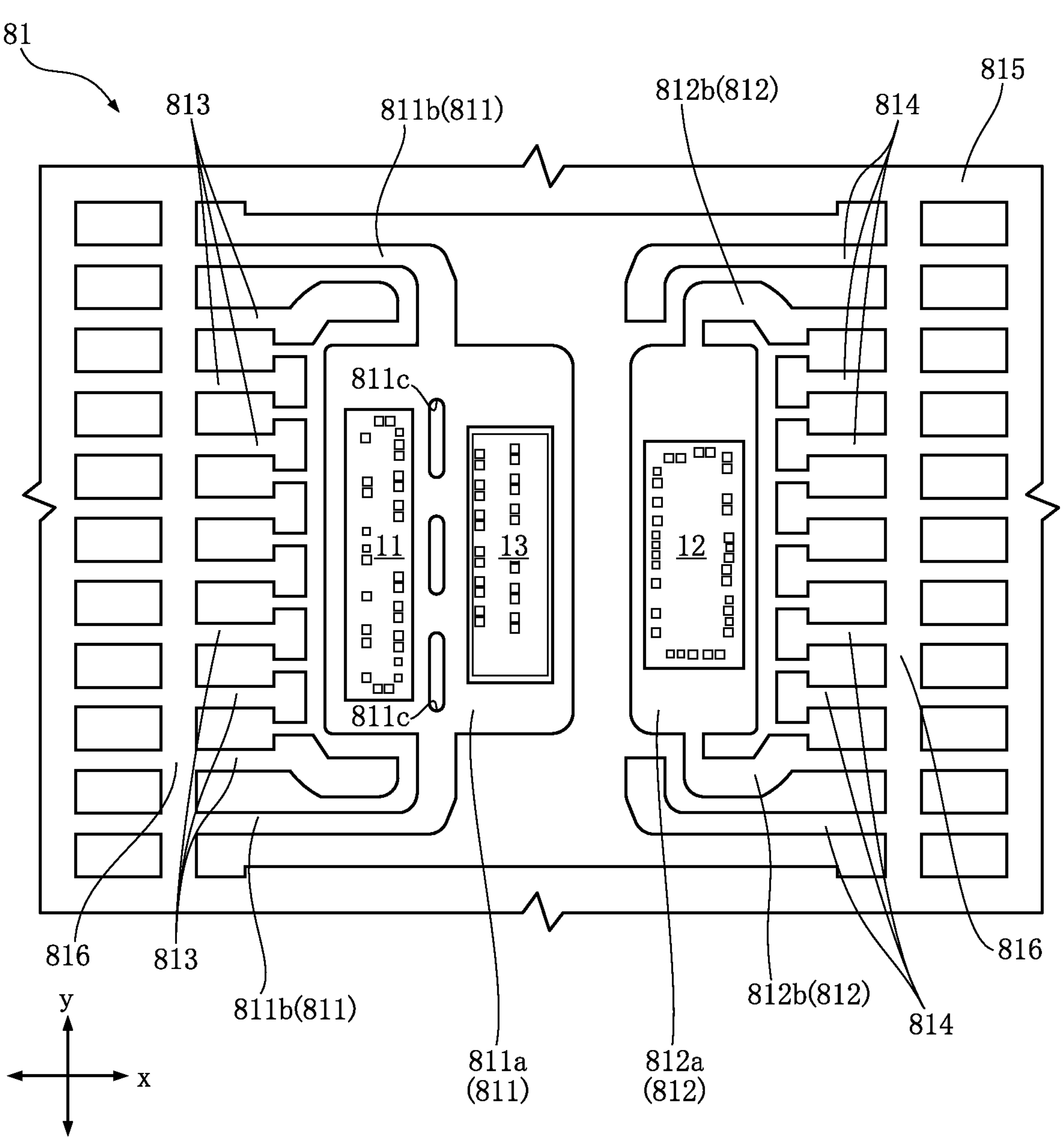
FIG. 13 is a plan view for illustrating a step of the method shown in FIG. 9.

Next, in the element mounting step S13, the first semiconductor element 11, the second semiconductor element 12 and the third semiconductor element 13 are mounted on the lead frame 81 as shown in FIG. 13. Specifically, the first semiconductor element 11 and the third semiconductor element 13 are bonded to the first island 811*a* via a conductive bonding material, which is not shown, and the second semiconductor element 12 is bonded to the second island 812*a* via a conductive bonding material, which is not shown.

Figure 14:
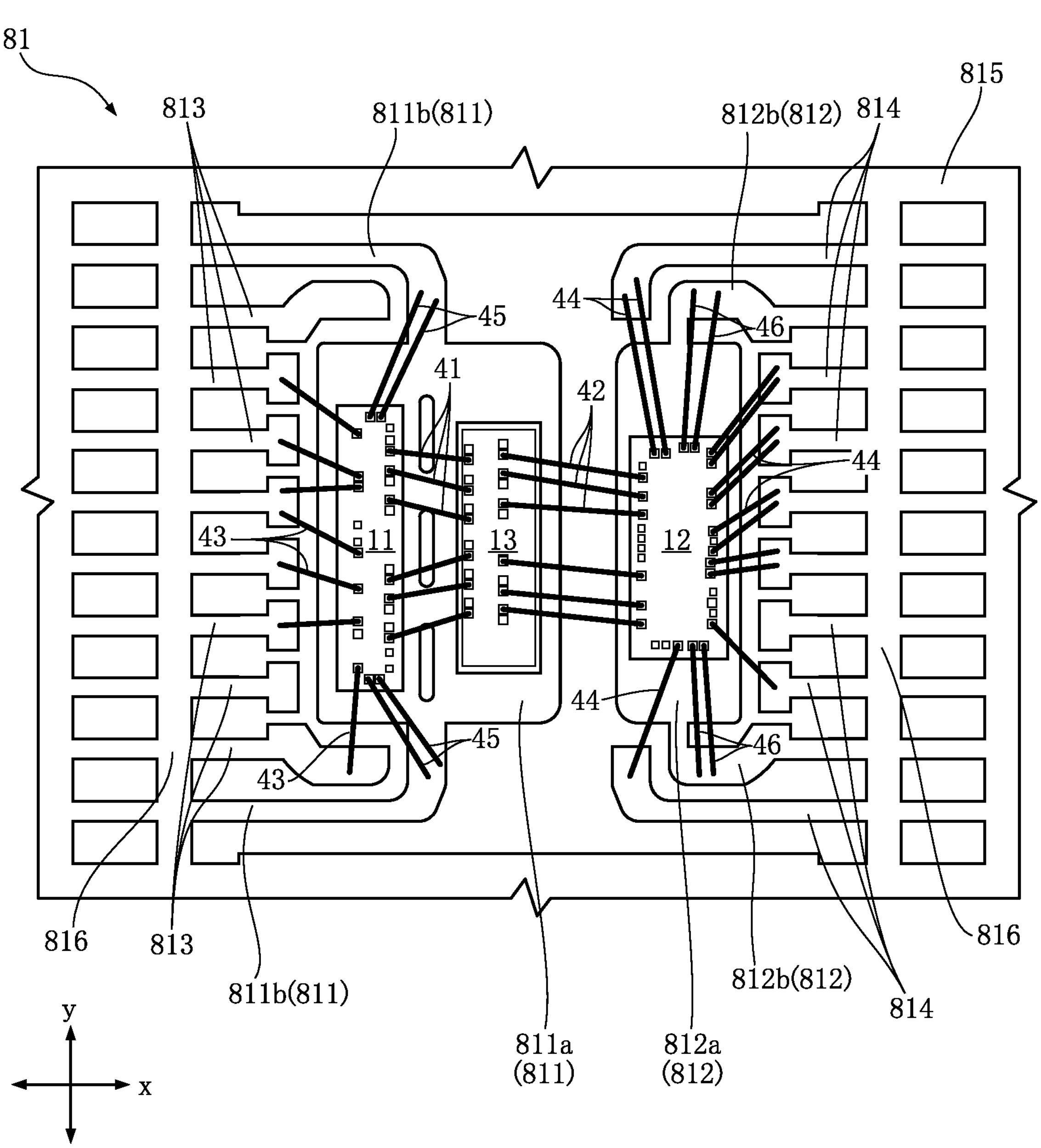
FIG. 14 is a plan view for illustrating a step of the method shown in FIG. 9.

Next, in the wire bonding step S14, the first wires 41, the second wires 42, the third wires 43, the fourth wires 44, the fifth wires 45 and the sixth wires 46 are formed as shown in FIGS. 14 and 15. The wires 41 to 46 can be formed by using a known wire bonder. The order of forming the wires 41 to 46 is not particularly limited.

In the present embodiment, the wire bonding step S14 includes the second design process S102 and the third design process S103 as shown in FIG. 9.

The second design process S102 determines the design of the first wires 41 and the second wires 42 to be formed, ensuring that the distance d2 between the first wire 41 and the second wire 42 is greater than the distance d0. For example, when the first wires 41 are bonded before the second wires 42, each second wire 42 is bonded such that the neck part 421 of the second wire 42 is at least the distance d0 away from the neck part 411 of each first wire 41. Reversely, when the second wires 42 are bonded before the first wires 41, each first wire 41 is bonded such that the neck part 411 of the first wire 41 is at least the distance d0 away from the neck part 421 of each second wire 42. Preferably, the second design process S102 determines the distance d2 to be greater than the distance d0 without exceeding, for example, 10 mm, for avoiding an increase in size of the semiconductor device A1 to be manufactured.

The third design process S103 determines the design of the second wires 42 to be formed, ensuring that the distance d3 between each second wire 42 and the third semiconductor element 13 in the thickness direction z is greater than the distance d0. It is also ensured that the distance d3' between each second wire 42 and the first lead 811 in the thickness direction z is greater than the distance d0. Specifically, for example, each second wire 42 is bonded such that the loop part 423 of the second wire 42 is at least the distance d0 away from the seal ring part 133 of the third semiconductor element 13 and also from the first island 811*a*. As will be understood from the details given below, the first lead 811 corresponds to the first lead 31. Hence, the distance d3' that is determined to be greater than the distance d0 by the third design process S103 is the distance d3' between each second wire 42 and the first lead 31 in the thickness direction z. Preferably, the third design process S103 determines the distance d3 to be greater than the distance d0 without exceeding, for example, 10 mm, for avoiding an increase in size of the semiconductor device A1 to be manufactured. Preferably, in addition, the third design process S103 determines the distance d3' to be greater than the distance d0 without exceeding, for example, 10 mm, for avoiding an increase in size of the semiconductor device A1 to be manufactured.

Next, the sealing resin 5 is formed in the sealing step S15. The sealing resin 5 is formed by transfer molding. The sealing resin 5 is made of epoxy resin, for example.

Then, in the chip separating step S16, individual chips are separated by dicing. As a result, the first lead 811, the second lead 812 and the leads 813 and 814 are appropriately separated from the outer frame 815 and the dam bars 816. The thus separated first lead 811 forms the first lead 31. Specifically, the first island 811*a* forms the first island part 311, and the support leads 811*b* form the first terminal parts 312. Similarly, the thus separated second lead 812 forms the second lead 32. Specifically, the second island 812*a* forms the second island part 321, and the support leads 812*b* form the second terminal parts 322. Similarly, the thus separated leads 813 form the third leads 33, and the thus separated leads 814 form the fourth leads 34. Note that the process of bending the third leads 33 (the leads 813) and the fourth leads 34 (the leads 814) may be performed in the chip separating step S16 or at the time of the punching in the lead frame preparing step S11.

Through the steps described above, the semiconductor device A1 is obtained. The method for manufacturing the semiconductor device A1 is not limited to the example described above. For example, the first island 811*a*, the second island 812*a* and the through-holes 813*c* may be formed by punching in the lead frame preparing step S11. Then, the lead frame processing step S12 may be omitted. In this case, the first design process S101 is performed in the lead frame preparing step S11. Note, however, that forming the first island 811*a* and the second island 812*a* by etching in the lead frame processing step S12 can be more precise than by punching in the lead frame preparing step S11, resulting the distance d1 that is more precise and greater than the distance d0. In another manufacturing method, the lead frame preparing step S11 may be performed to prepare a copper plate that is rectangular in plan view. Then, the lead frame processing step S12 is performed to apply a resist 82 to the copper plate followed by etching, thereby forming all of the first lead 811 (the first island 811*a* and the support leads 811*b*), the second lead 812 (the second island 812*a* and the support leads 812*b*), the leads 813 and 814, the outer frame 815 and the dam bars 816 at once.

Next, the operation and effect of the semiconductor device A1, the method for designing the semiconductor device A1, and the method for manufacturing the semiconductor device A1 will be described.

In the semiconductor device A1, the distance d1 between the first lead 31 and the second lead 32 in the first direction x is greater than the distance d0 given by Equation (1) above. As described above, the distance d0 is calculated from the number of years of insulation life Y expected for the semiconductor device A1, the voltage X used in the semiconductor device A1, and the constant A determined by the material of the sealing resin 5. The present inventors have found that Equation (1) above can be used to design a structure with sufficient dielectric strength for practical use conditions. Based on the findings, the semiconductor device A1 is designed to have the distance d1 greater than the distance d0, ensuring sufficient dielectric strength for practical use conditions between the first lead 31 and the second lead 32. With the sufficient dielectric strength between the first lead 31 and the second lead 32, the semiconductor device A1 can prevent occurrence of dielectric breakdown. The method for designing the semiconductor device A1 includes the first design process S101 of determining the distance d1 to be greater than the distance d0. Consequently, the semiconductor device A1 can be designed and manufactured to be capable of preventing dielectric breakdown.

In the semiconductor device A1, the distance d2 between the first wire 41 and the second wire 42 is greater than the distance d0 given by Equation (1). In the present embodiment, the distance d2 is a distance between the neck part 411 of a first wire 41 and the neck part 421 of a second wire 42 in a direction orthogonal to the thickness direction z. The first wires 41, which are electrically connected to the first semiconductor element 11, are components of the first circuit. In contrast, the second wires 42, which are electrically connected to the second semiconductor element 12, are components of the second circuit. That is, the first wires 41 will have a lower voltage and the second wires 42 will have a higher voltage, resulting in a potential difference between the first wires 41 and the second wires 42. With the distance d2 designed to be greater than the distance d0, the semiconductor device A1 can achieve sufficient dielectric strength for practical use conditions between the first wires 41 and the second wires 42. With the sufficient dielectric strength between the first wires 41 and the second wires 42, the semiconductor device A1 can prevent occurrence of dielectric breakdown. The method for designing the semiconductor device A1 includes the second design process S102 of determining the distance d2 to be greater than the distance d0. Consequently, the semiconductor device A1 can be designed and manufactured to be capable of preventing dielectric breakdown.

In the semiconductor device A1, the distance d3 between each second wire 42 and the third semiconductor element 13 is greater than the distance d0 given by Equation (1) above. In the present embodiment, the distance d3 is a distance between the loop part 423 of a second wire 42 and the seal ring part 133 of the third semiconductor element 13 in the thickness direction z. The second wires 42, which are electrically connected to the second semiconductor element 12, are components of the second circuit. In contrast, the third semiconductor element 13 is bonded to the first island part 311 (the first lead 31), so that the seal ring part 133 will be held at the same potential as the first island part 311. In other words, the second wires 42 will have a higher voltage and the seal ring part 133 will have a lower voltage, resulting in a potential difference between the second wires 42 and the seal ring part 133. With the distance d3 designed to be greater than the distance d0, the semiconductor device A1 can achieve sufficient dielectric strength for practical use conditions between the second wires 42 and the seal ring part 133. With the sufficient dielectric strength between the second wires 42 and the third semiconductor element 13, the semiconductor device A1 can prevent occurrence of dielectric breakdown. The method for designing the semiconductor device A1 includes the third design process S103 of determining the distance d3 to be greater than the distance d0. Consequently, the semiconductor device A1 can be designed and manufactured to be capable of preventing dielectric breakdown.

In the semiconductor device A1, the distance d3' between each second wire 42 and the first lead 31 is greater than the distance d0 given by Equation (1) above. In the present embodiment, the distance d3' is a distance between the loop part 423 of a second wire 42 and the first mounting surface 311*a* of the first island part 311 (the first lead 31) in the thickness direction z. The second wires 42, which are electrically connected to the second semiconductor element 12, are components of the second circuit. In contrast, the first lead 31 is a component of the first circuit. That it, the second wires 42 will have a higher voltage and the first lead 31 will have a lower voltage, resulting in a potential difference between the second wires 42 and the first lead 31. With the distance d3' designed to be greater than the distance d0, the semiconductor device A1 can achieve sufficient dielectric strength for practical use conditions between the second wires 42 and the first lead 31. With the sufficient dielectric strength between the second wires 42 and the first lead 31, the semiconductor device A1 can prevent occurrence of dielectric breakdown. The method for designing the semiconductor device A1 includes the third design process S103 of determining the distance d3' to be greater than the distance d0 given above. Consequently, the semiconductor device A1 can be designed and manufactured to be capable of preventing dielectric breakdown.

Figure 16:
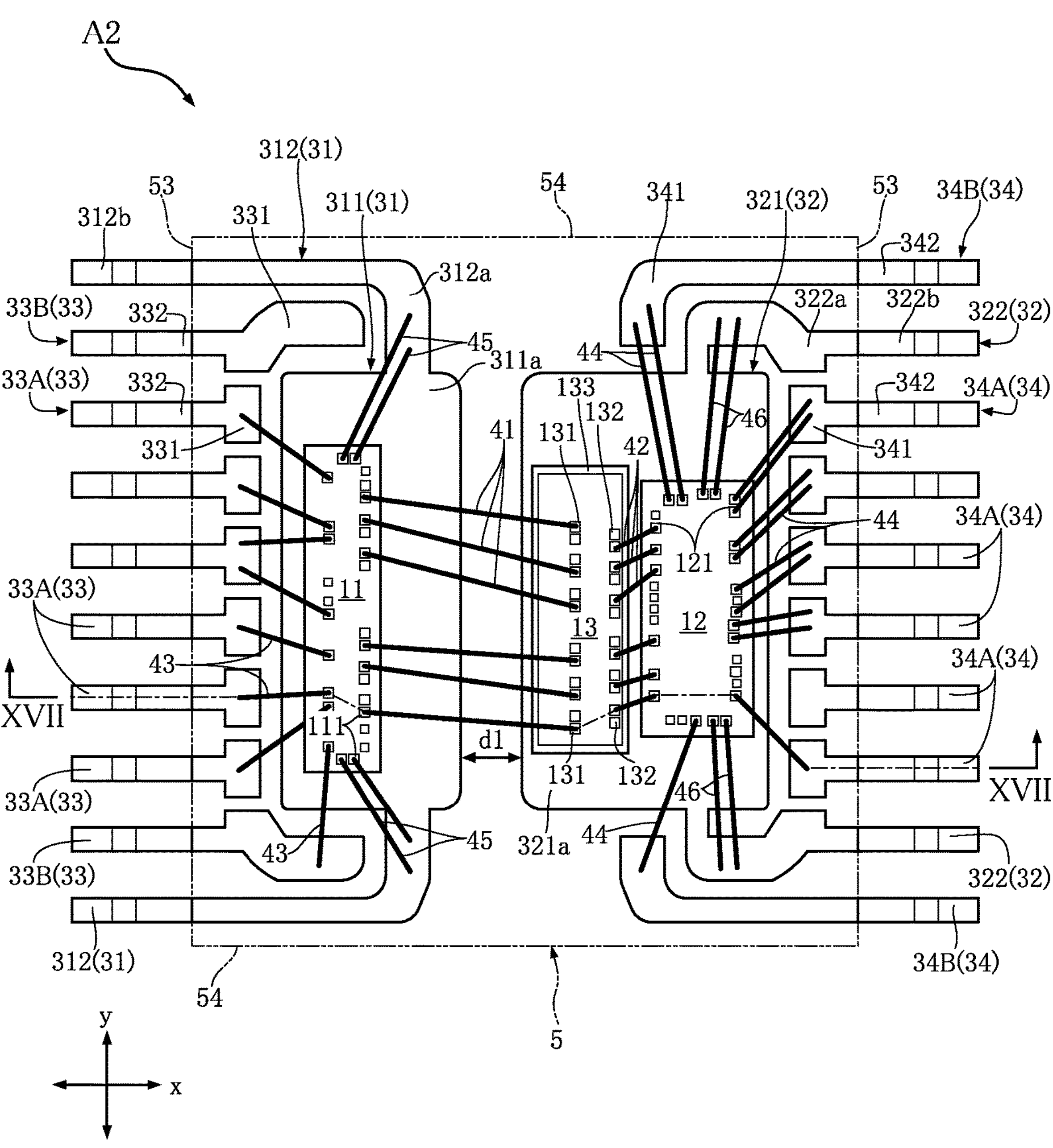
FIG. 16 is a plan view of a semiconductor device according to a second embodiment.
Figure 17:
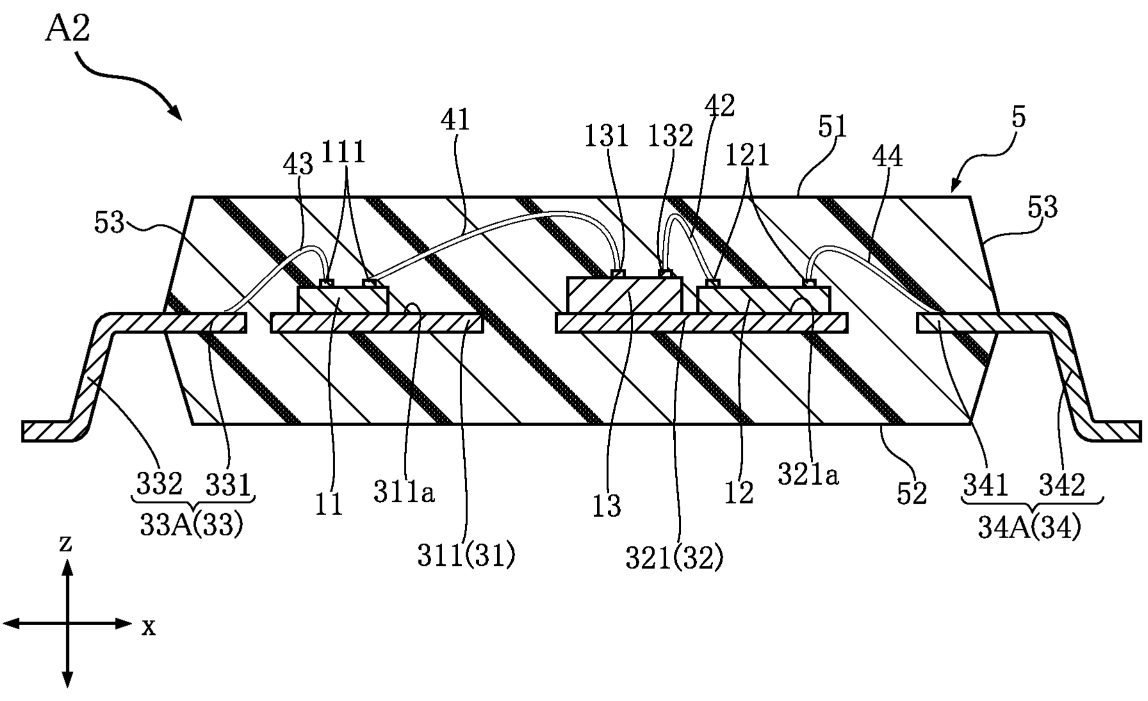
FIG. 17 is a sectional view of FIG. 16 taken along line XVII-XVII.
Figure 18:
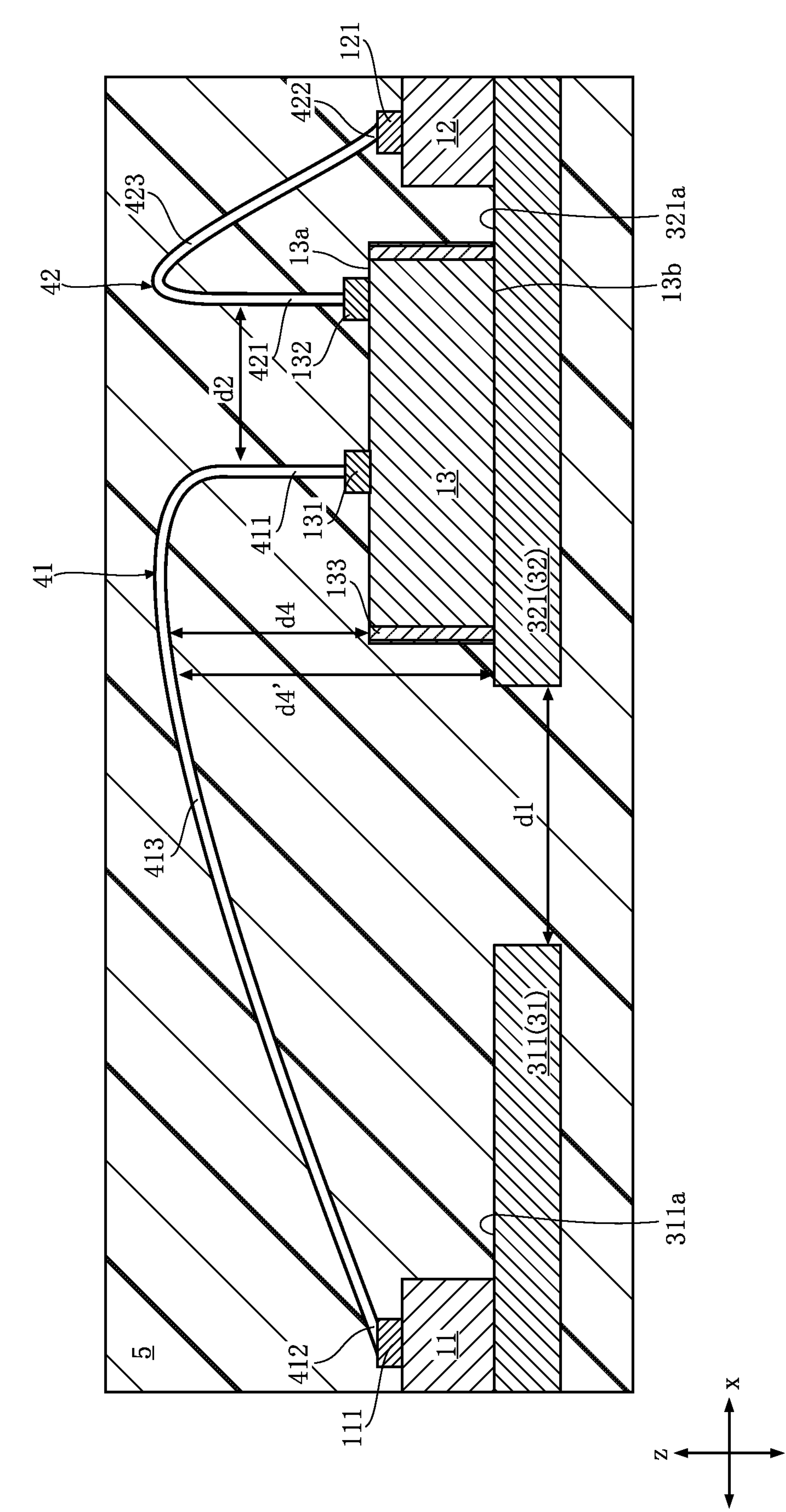
FIG. 18 is a partially enlarged sectional view in which a part of FIG. 17 is enlarged.

FIGS. 16 to 18 show a semiconductor device A2 according to a second embodiment. FIG. 16 is a plan view of the semiconductor device A2, with a sealing resin 5 indicated by imaginary lines. FIG. 17 is a sectional view of FIG. 16 taken along line XVII-XVII. FIG. 18 is a partially enlarged sectional view in which a part of FIG. 17 is enlarged.

As shown in FIGS. 16 to 18, the semiconductor device A2 differs from the semiconductor device A1 in that the third semiconductor element 13 is mounted not on the first lead 31 but on the second lead 32. The third semiconductor element 13 is bonded to the second island part 321 of the second lead 32 via a conductive bonding material, which is not shown. The semiconductor device A2 also differs in the third semiconductor element 13 where, as shown in FIG. 16, the pads 131 are closer to the center than the pads 132 in plan view.

The semiconductor device A2 is similar to the semiconductor device A1 in that the components of the first circuit and the components of the second circuit are separated at least by the distance d0 (mm) given by Equation (1) above.

Specifically, the distance d1 between the first lead 31 and the second lead 32 in the first direction x (see FIG. 18), as well as the distance d2 between the first wire 41 and the second wire 42 (see FIG. 18), is greater than the distance d0 given by Equation (1) above.

In addition, a distance d4 between each first wire 41 and the third semiconductor element 13 (see FIG. 18) is greater than the distance d0 given above. In the example shown in FIG. 18, the distance d4 is a distance in the thickness direction z between the loop part 413 and the seal ring part 133 of the third semiconductor element 13 measured where they are nearest to each other. The distance d4 may be 10 mm or less, for example. This can avoid increasing the size of the semiconductor device A2. In the semiconductor device A2, the distance d4 is about 170 μm and hence greater than the distance d0 (≈29.4 μm) of the above example.

In addition, a distance d4' between each first wire 41 and the second lead 32 (see FIG. 18) is greater than the distance d0 given above. In the example shown in FIG. 18, the distance d4' is a distance in the thickness direction z between the loop part 413 and the second mounting surface 321*a* of the second island part 321 measured where they are nearest to each other. In one example, the distance d4' may be 10 mm or less. This can avoid increasing the size of the semiconductor device A2. In the semiconductor device A2, the distance d4' is about 470 μm and hence greater than the distance d0 (≈29.4 μm) of the above example.

Figure 19:
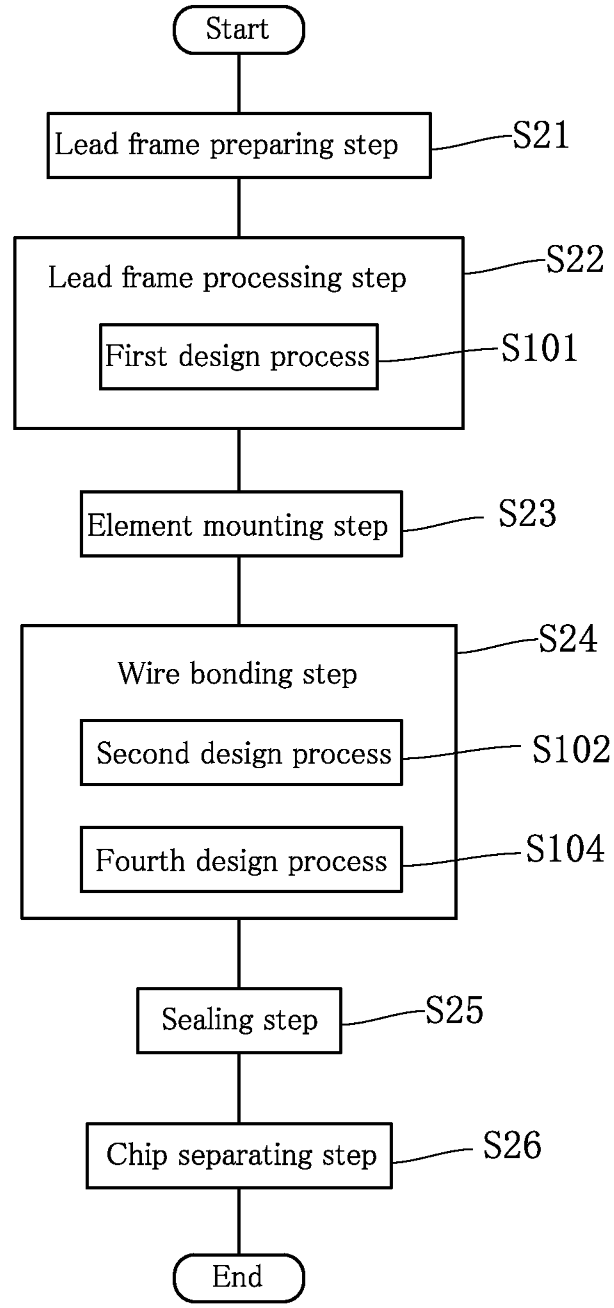
FIG. 19 is a flowchart of an example of a method for manufacturing a semiconductor device according to the second embodiment.
Figure 20:
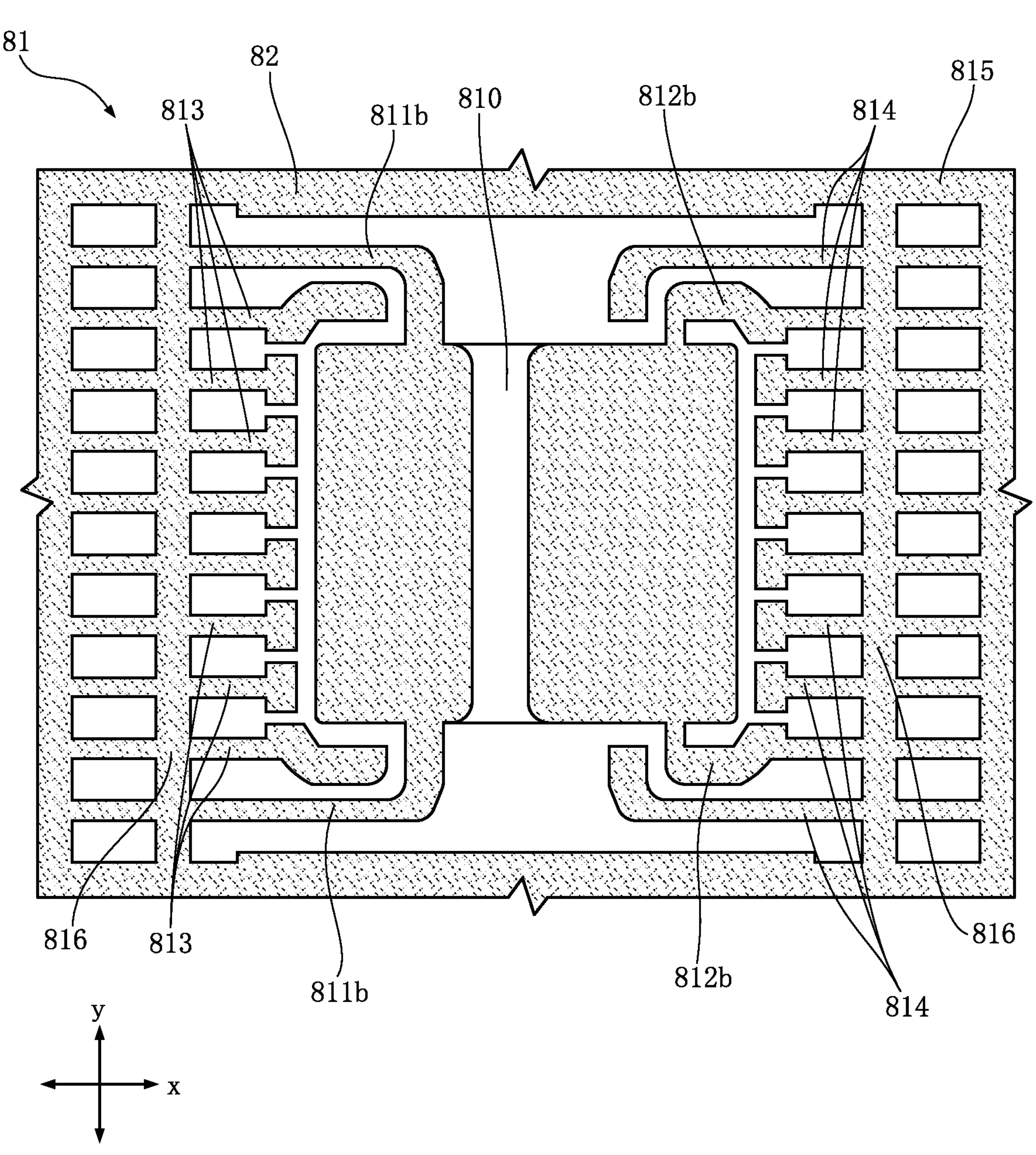
FIG. 20 is a plan view for illustrating a step of the method shown in FIG. 19.
Figure 21:
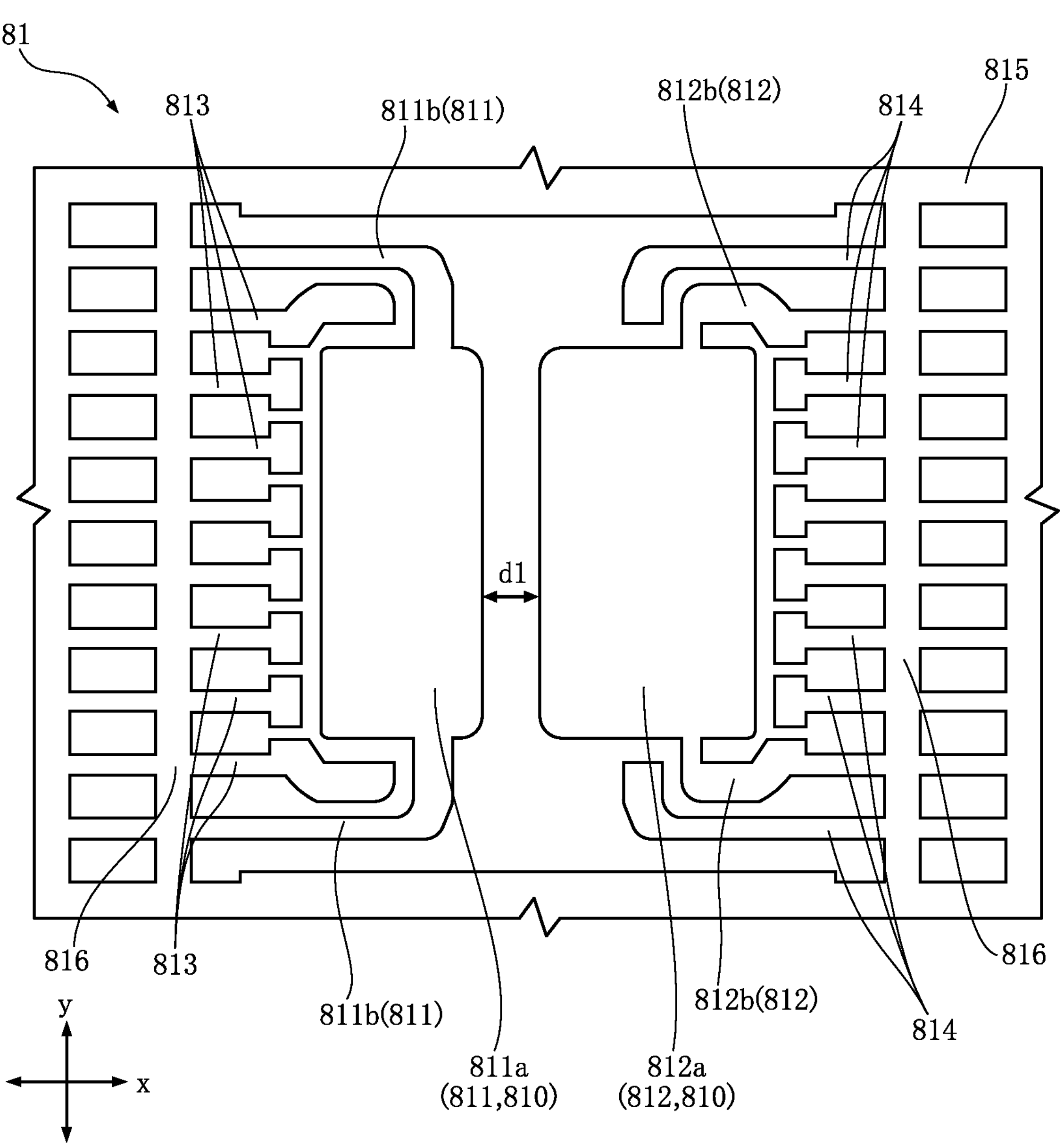
FIG. 21 is a plan view for illustrating a step of the method shown in FIG. 19.
Figure 22:
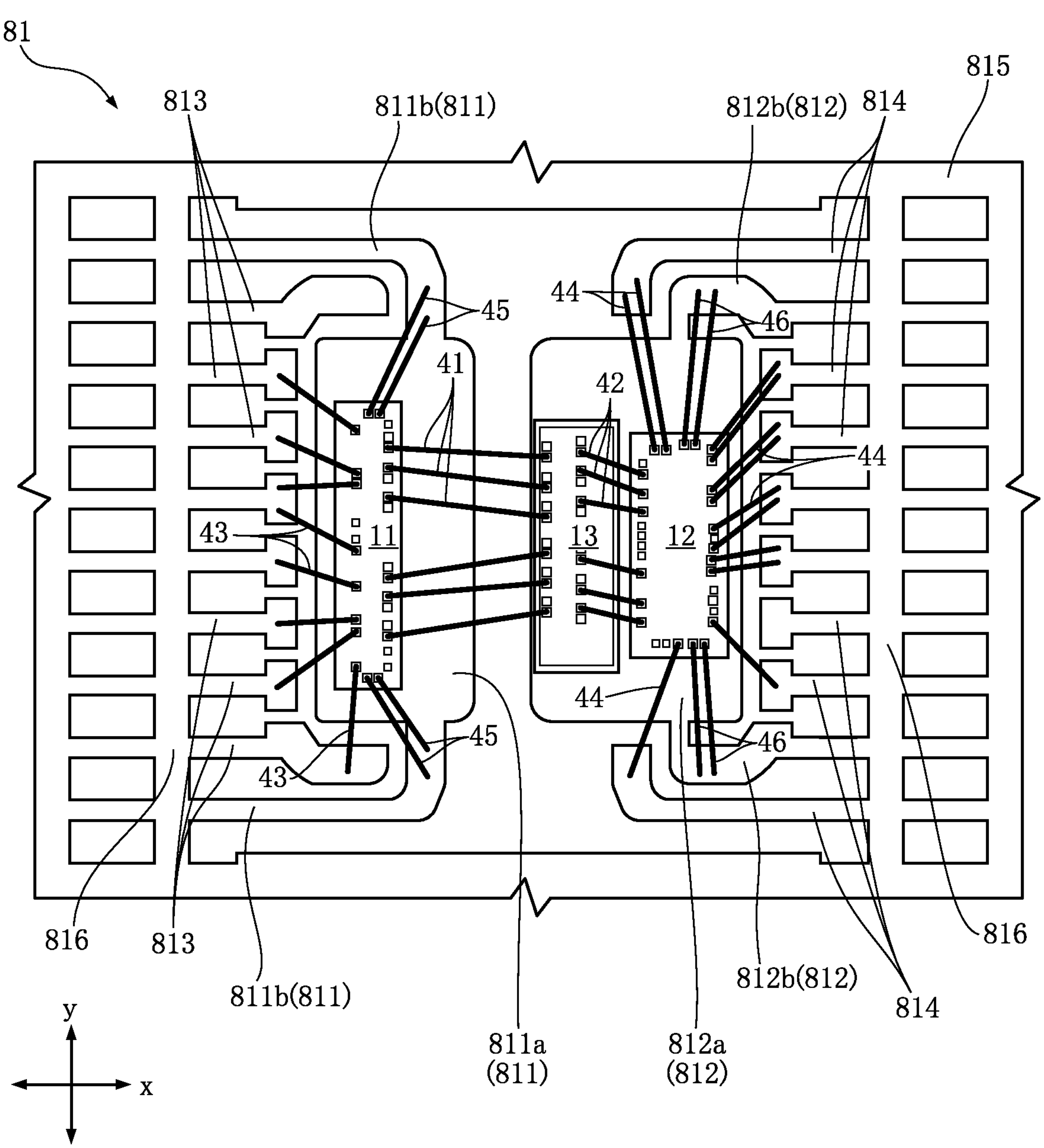
FIG. 22 is a plan view for illustrating a step of the method shown in FIG. 19.
Figure 23:
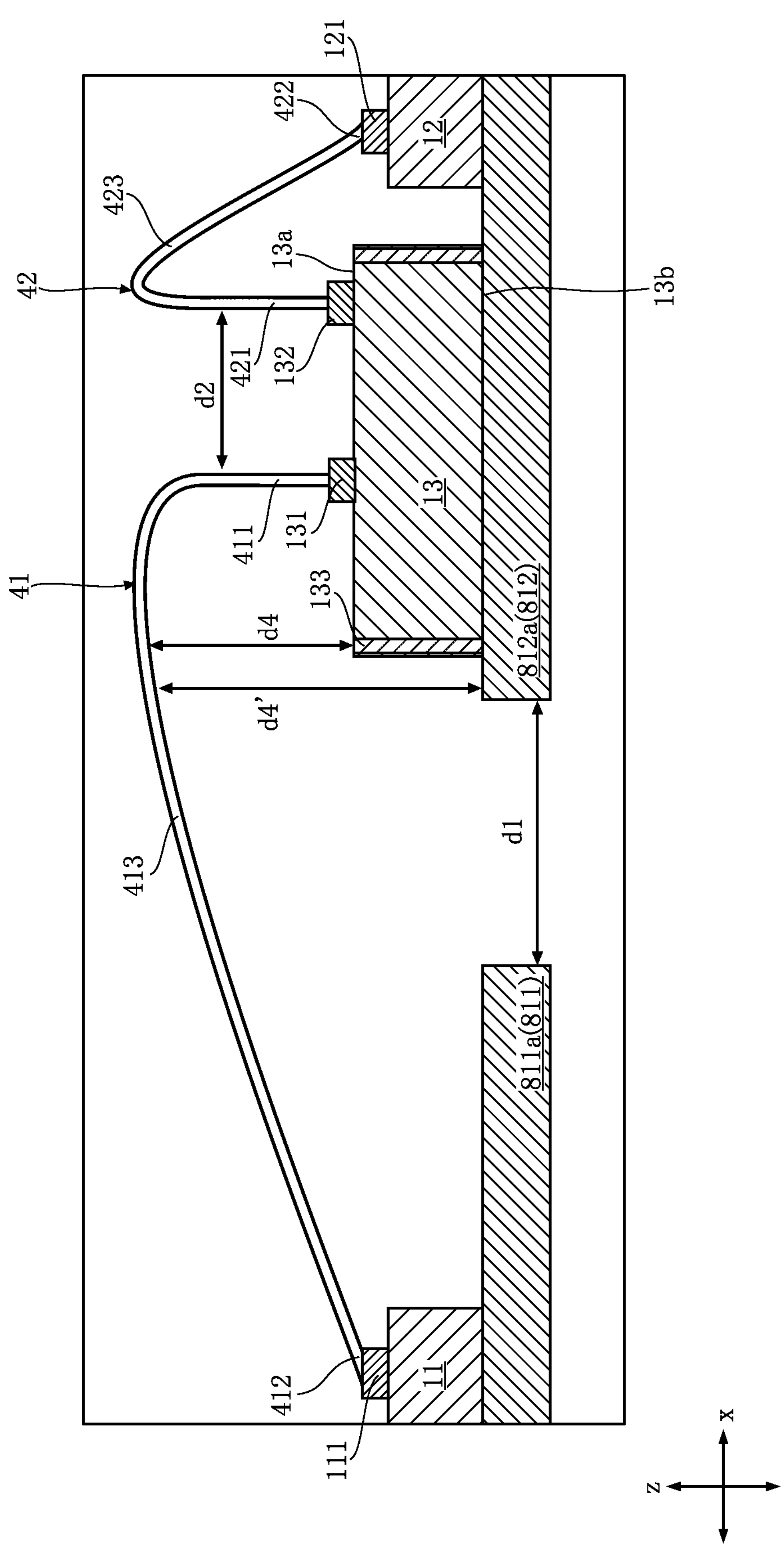
FIG. 23 is a sectional view for illustrating a step of the method shown in FIG. 19.

Next, the following describes an example of a method for manufacturing the semiconductor device A2 with reference to FIGS. 19 to 23. FIG. 19 is a flowchart of an example of a method for manufacturing the semiconductor device A2. FIGS. 20 to 22 are plan views illustrating steps of the method for manufacturing the semiconductor device A2. FIG. 23 is a sectional view illustrating a step of the method for manufacturing the semiconductor device A2. FIG. 23 shows a section taken along the same line as the section shown in FIG. 18.

As shown in FIG. 19, the method for manufacturing the semiconductor device A2 includes a lead frame preparing step S21, a lead frame processing step S22, an element mounting step S23, a wire bonding step S24, a sealing step S25 and a chip separating step S26. The method for manufacturing the semiconductor device A2 includes a design method having a design step. The design step includes a first design process S101, a second design process S102 and a fourth design process S104, which is described later.

In the lead frame preparing step S21, which is similar to the lead frame preparing step S11, a lead frame 81 shown in FIG. 10 is prepared.

Next, in the lead frame processing step S22, which is similar to the lead frame processing step S12 of the first embodiment, the flat plate 810 of the lead frame 81 is divided into a first island 811*a* and a second island 812*a* (see FIG. 21). As shown in FIG. 20, however, the resist 82 applied in the lead frame processing step S22 covers a different region as compared with the region covered in the lead frame processing step S12. By the lead frame processing step S22, the lead frame 81 shown in FIG. 21 is formed. As shown in FIG. 21, the thus formed lead frame 81 includes the first lead 811 composed of the first island 811*a* and the support leads 811*b* and the second lead 812 composed of the second island 812*a* and support leads 812*b*.

The lead frame processing step S22 of the present embodiment is similar to the lead frame processing step S12 and includes the first design process S101 as shown in FIG. 19.

Next, in the element mounting step S23, the first semiconductor element 11, the second semiconductor element 12 and the third semiconductor element 13 are mounted on the lead frame 81 as shown in FIG. 22. Unlike the element mounting step S13, the element mounting step S23 includes mounting the third semiconductor element 13 on the second island 812*a* (the second lead 812).

Next, in the wire bonding step S24, the first wires 41, the second wires 42, the third wires 43, the fourth wires 44, the fifth wires 45 and the sixth wires 46 are formed as shown in FIGS. 22 and 23.

In the present embodiment, the wire bonding step S24 includes the second design process S102 and the fourth design process S104 as shown in FIG. 19. The wire bonding step S24 differs from the wire bonding step S14 in that the fourth design process S104 is included in place of the third design process S103.

The fourth design process S104 determines the design of the first wires 41 to be formed, ensuring that the distance d4 between each first wire 41 and the third semiconductor element 13 in the thickness direction z is greater than the distance d0. It is also ensured that the distance d4' between each first wire 41 and the second lead 812 in the thickness direction z is greater than the distance d0. Specifically, for example, each first wire 41 is bonded such that the loop part 413 of the first wire 41 is at least the distance d0 away from the seal ring part 133 of the third semiconductor element 13 and also from the second island 812*a*. As described above, the third semiconductor element 13 of the semiconductor device A2 has the pads 131 located closer to the center than the pads 132, so that the first wires 41 can be bonded to largely bypass the seal ring part 133. As will be understood from the details given below, the second lead 812 corresponds to the second lead 32. Hence, the distance d4' that is determined to be greater than the distance d0 by the fourth design process S104 is the distance d4' between the first wires 41 and the second lead 32 in the thickness direction z. Preferably, the fourth design process S104 determines the distance d4 to be greater than the distance d0 without exceeding, for example, 10 mm, for avoiding an increase in size of the semiconductor device A2 to be manufactured. Preferably, in addition, the fourth design process S104 determines the distance d4' to be greater than the distance d0 without exceeding, for example, 10 mm, for avoiding an increase in size of the semiconductor device A2 to be manufactured.

Next, the sealing resin 5 is formed in the sealing step S25, which is similar to the sealing step S15. The sealing resin 5 is formed by transfer molding.

Then, in the chip separating step S26, which is similar to the chip separating step S16, individual chips are separated.

Through the steps described above, the semiconductor device A2 is obtained. Similarly to the method for manufacturing the semiconductor device A1, the method for manufacturing the semiconductor device A2 may form the first island 811*a* and the second island 812*a* in the lead frame preparing step S21. In another manufacturing method, the lead frame preparing step S21 may be performed to prepare a copper plate that is rectangular in plan view, and then the lead frame processing step S22 may be performed to form the lead frame 81 having the shape shown in FIG. 12 form the copper prate.

Next, the operation and effect of the semiconductor device A2, the method for designing the semiconductor device A2, and the method for manufacturing the semiconductor device A2 will be described.

Similarly to the semiconductor device A1, the semiconductor device A2 has the distance d1 between the first lead 31 and the second lead 32 in the first direction x that is greater than the distance d0. The semiconductor device A2 can therefore achieve sufficient dielectric strength for practical use conditions between the first lead 31 and the second lead 32 and prevent occurrence of dielectric breakdown. Consequently, the semiconductor device A2 can be designed and manufactured to be capable of preventing dielectric breakdown.

In the semiconductor device A2, the distance d4 between each first wire 41 and the third semiconductor element 13 is greater than the distance d0 given by Equation (1) above. In the present embodiment, the distance d4 is a distance between the loop part 413 of a first wire 41 and the seal ring part 133 of the third semiconductor element 13 in the thickness direction z. The first wires 41, which are electrically connected to the first semiconductor element 11, are components of the first circuit. In contrast, the third semiconductor element 13 is bonded to the second island part 321 (the second lead 32), so that the seal ring part 133 will be held at the same potential as the second island part 321. In other words, the first wires 41 will have a lower voltage and the seal ring part 133 will have a higher voltage, resulting in a potential difference between the first wires 41 and the seal ring part 133. With the distance d4 designed to be greater than the distance d0, the semiconductor device A2 can achieve sufficient dielectric strength for practical use conditions between the first wires 41 and the seal ring part 133. With the sufficient dielectric strength between the first wires 41 and the third semiconductor element 13, the semiconductor device A2 can prevent occurrence of dielectric breakdown. The method for designing the semiconductor device A2 includes the fourth design process S104 of determining the distance d4 to be greater than the distance d0. Consequently, the semiconductor device A2 can be designed and manufactured to be capable of preventing dielectric breakdown.

In the semiconductor device A2, the distance d4' between each first wire 41 and the second lead 32 is greater than the distance d0 given by Equation (1) above. In the present embodiment, the distance d4' is a distance between the loop part 413 of a first wire 41 and the second mounting surface 321*a* of the second island part 321 (the second lead 32) in the thickness direction z. The first wires 41, which are electrically connected to the first semiconductor element 11, are components of the first circuit. In contrast, the second lead 32 is a component of the second circuit. That it, the first wires 41 will have a lower voltage and the second lead 32 will have a higher voltage, resulting in a potential difference between the first wires 41 and the second lead 32. With the distance d4' designed to be greater than the distance d0, the semiconductor device A2 can achieve sufficient dielectric strength for practical use conditions between the first wires 41 and the second lead 32. With the sufficient dielectric strength between the first wires 41 and the second lead 32, the semiconductor device A2 can prevent occurrence of dielectric breakdown. The method for designing the semiconductor device A2 includes the fourth design process S104 of determining the distance d4' to be greater than the distance d0. Consequently, the semiconductor device A2 can be designed and manufactured to be capable of preventing dielectric breakdown.

The present disclosure is not limited to the semiconductor devices, the methods for designing a semiconductor device, and the methods for manufacturing a semiconductor device of the embodiments described above. Various design changes can be made to the specific configuration of each part of the semiconductor devices and also to the specific process of each step of the method for designing a semiconductor device, and the methods for manufacturing a semiconductor device of the embodiments described above. For example, the present disclosure includes embodiments described in the following clauses.

Clause 1. A semiconductor device comprising:

a first semiconductor element;

a second semiconductor element;

a conductive support that includes a first lead and a second lead spaced apart from each other in a first direction orthogonal to a thickness direction of the first semiconductor element;

a third semiconductor element supported by the conductive support, electrically connected to the first semiconductor element and the second semiconductor element, and insulating the first semiconductor element and the second semiconductor element from each other; and a sealing resin covering the first semiconductor element, the second semiconductor element, the third semiconductor element and a part of the conductive support, wherein the first semiconductor element is supported by the first lead, the second semiconductor element is supported by the second lead, and a distance d1 between the first lead and the second lead in the first direction is greater than a distance d0 given by Equation (2), $$d0 = \sqrt[B]{\frac{Y}{A}} \times 0.15 \times X \tag{2}$$

where Y is a number of years of insulation life (years) expected for the semiconductor device, A and B are constants determined by a material of the sealing resin, and X is a voltage (kVrms).

Clause 2. The semiconductor device according to Clause 1, wherein the distance d1 is 10 mm or less.

Clause 3. The semiconductor device according to Clause 1 or 2, further comprising:

a first wire connected to the first semiconductor element and the third semiconductor element; and a second wire connected to the second semiconductor element and the third semiconductor element, wherein a distance d2 between the first wire and the second wire is greater than the distance d0 given by Equation (2).

Clause 4. The semiconductor device according to Clause 3, wherein the distance d2 is 10 mm or less.

Clause 5. The semiconductor device according to Clause 3 or 4, wherein the third semiconductor element is supported by the first lead, and a distance d3 between the second wire and the third semiconductor element is greater than the distance d0 given by Equation (2).

Clause 6. The semiconductor device according to Clause wherein the distance d3 is 10 mm or less.

Clause 7. The semiconductor device according to Clause 3 or 4, wherein the third semiconductor element is supported by the second lead, and a distance d4 between the first wire and the third semiconductor element is greater than the distance d0 given by Equation (2).

Clause 8. The semiconductor device according to Clause 7, wherein the distance d4 is 10 mm or less.

Clause 9. A method for designing a semiconductor device, the semiconductor device including:

a first semiconductor element;

a second semiconductor element;

a conductive support that includes a first lead and a second lead spaced apart from each other in a first direction orthogonal to a thickness direction of the first semiconductor element;

a third semiconductor element supported by the conductive support, electrically connected to the first semiconductor element and the second semiconductor element, and insulating the first semiconductor element and the second semiconductor element from each other; and a sealing resin covering the first semiconductor element, the second semiconductor element, the third semiconductor element and a part of the conductive support, wherein the first semiconductor element is supported by the first lead and the second semiconductor element is supported by the second lead, the method comprising a design step including a first design process of determining a distance d1 between the first lead and the second lead in the first direction to be greater than a distance d0 given by Equation (3), $$d0 = \sqrt[B]{\frac{Y}{A}} \times 0.15 \times X \tag{3}$$

where Y is a length of insulation life (years) expected for the semiconductor device, A and B are constants determined by a material of the sealing resin, and X is a voltage (kVrms).

Clause 10. The method according to Clause 9, wherein the first design process determines the distance d1 to be 10 mm or less.

Clause 11. The method according to Clause 9 or 10, wherein the semiconductor device further includes:

a first wire connected to the first semiconductor element and the third semiconductor element; and a second wire connected to the second semiconductor element and the third semiconductor element, and the design step includes a second design process of determining a distance d2 between the first wire and the second wire to be greater than the distance d0 given by Equation (3).

Clause 12. The method according to Clause 11, wherein the second design process determines the distance d2 to be 10 mm or less.

Clause 13. The method according to Clause 11 or 12, wherein in the semiconductor device, the third semiconductor element is supported by the first lead, and the design step includes a third design process of determining a distance d3 between the second wire and the third semiconductor element to be greater than the distance d0 given by Equation (3).

Clause 14. The method according to Clause 13, wherein the third design process determines the distance d3 to be 10 mm or less.

Clause 15. The method according to Clause 11 or 12, wherein in the semiconductor device, the third semiconductor element is supported by the second lead, and the design step includes a fourth design process of determining a distance d4 between the first wire and the third semiconductor element to be greater than the distance d0 given by Equation (3).

Clause 16. The method according to Clause 15, wherein the fourth design process determines the distance d4 to be 10 mm or less.

Clause 17. A method for manufacturing a semiconductor device, comprising the method for designing a semiconductor device, according to any one of Clauses 9 to 16.

| REFERENCE NUMERALS | |
|---|---|
| A1, A2: | Semiconductor device |
| 11: | First semiconductor element |

-continued

| REFERENCE NUMERALS | |
|---|---|
| 11a: | Obverse surface |
| 11b: | Reverse surface |
| 111: | Pad |
| 12: | Second semiconductor element |
| 12a: | Obverse surface |
| 12b: | Reverse surface |
| 121: | Pad |
| 13: | Third semiconductor element |
| 13a: | Obverse surface |
| 13b: | Reverse surface |
| 131: | Pad |
| 132: | Pad |
| 133: | Seal ring part |
| 3: | Conductive support |
| 31: | First lead |
| 311: | First island part |
| 311a: | First mounting surface |
| 312: | First terminal part |
| 312a: | Covered part |
| 312b: | Exposed part |
| 313: | Through-hole |
| 32: | Second lead |
| 321: | Second island part |
| 321a: | Second mounting surface |
| 322: | Second terminal part |
| 322a: | Covered part |
| 322b: | Exposed part |
| 33: | Third lead |
| 33A: | Inner lead |
| 33B: | Outer lead |
| 331: | Covered part |
| 332: | Exposed part |
| 34: | Fourth lead |
| 34A: | Inner lead |
| 34B: | Outer lead |
| 341: | Covered part |
| 342: | Exposed part |
| 4: | Connecting member |
| 41: | First wire |
| 411: | Neck part |
| 412: | Bonded part |
| 413: | Loop part |
| 42: | Second wire |
| 421: | Neck part |
| 422: | Bonded part |
| 423: | Loop part |
| 43: | Third wire |
| 44: | Fourth wire |
| 45: | Fifth wire |
| 46: | Sixth wire |
| 5: | Sealing resin |
| 51: | Top surface |
| 52: | Bottom surface |
| 53: | First side surface |
| 531: | First upper part |
| 532: | First lower part |
| 533: | First middle part |
| 54: | Second side surface |
| 541: | Second upper part |
| 542: | Second lower part |
| 543: | Second middle part |
| 81: | Lead frame |
| 810: | Flat plate |
| 811: | First lead |
| 811a: | First island |
| 811b: | Support lead |
| 811c: | Through-hole |
| 812: | Second lead |
| 812a: | Second island |
| 812b: | Support lead |
| 813: | Lead |
| 813c: | Through-hole |
| 814: | Lead |
| 815: | Outer frame |
| 816: | Dam bar |
| 82: | Resist |

The invention claimed is:

1. A semiconductor device comprising:

a first semiconductor element;

a second semiconductor element;

a conductive support that includes a first lead and a second lead spaced apart from each other in a first direction orthogonal to a thickness direction of the first semiconductor element;

a third semiconductor element supported by the conductive support, electrically connected to the first semiconductor element and the second semiconductor element, and insulating the first semiconductor element and the second semiconductor element from each other;

a sealing resin covering the first semiconductor element, the second semiconductor element, the third semiconductor element and a part of the conductive support;

a first wire connected to the first semiconductor element and the third semiconductor element; and a second wire connected to the second semiconductor element and the third semiconductor element, wherein the first semiconductor element is supported by the first lead, the second semiconductor element is supported by the second lead, a distance d1 (mm) between the first lead and the second lead in the first direction is greater than a distance d0=0.0294 mm, the third semiconductor element includes a seal ring part having a shape of closed loop as viewed in the thickness direction, the second wire includes an inclined portion configured to come closer to the second semiconductor element in the thickness direction as proceeding from the third semiconductor element toward the second semiconductor element, the inclined portion crossing the seal ring part as viewed in the thickness direction, and a distance d3 between the inclined portion of the second wire and the seal ring part of the third semiconductor element in the thickness direction is greater than the distance d0.

2. The semiconductor device according to claim 1, wherein the distance d1 is 10 mm or less.

3. The semiconductor device according to claim 1, wherein a distance d2 between the first wire and the second wire is greater than the distance d0.

4. The semiconductor device according to claim 3, wherein the distance d2 is 10 mm or less.

5. The semiconductor device according to claim 3, wherein the third semiconductor element is supported by the first lead.

6. The semiconductor device according to claim 5, wherein the distance d3 is 10 mm or less.

7. The semiconductor device according to claim 3, wherein the third semiconductor element is supported by the second lead, and a distance d4 between the first wire and the third semiconductor element is greater than the distance d0.

8. The semiconductor device according to claim 7, wherein the distance d4 is 10 mm or less.

9. A method for designing a semiconductor device, the semiconductor device including:

a first semiconductor element;

a second semiconductor element;

a conductive support that includes a first lead and a second lead spaced apart from each other in a first direction orthogonal to a thickness direction of the first semiconductor element;

a third semiconductor element supported by the conductive support, electrically connected to the first semiconductor element and the second semiconductor element, and insulating the first semiconductor element and the second semiconductor element from each other, the third semiconductor element including a seal ring part that has a shape of closed loop as viewed in the thickness direction;

a sealing resin covering the first semiconductor element, the second semiconductor element, the third semiconductor element and a part of the conductive support;

a first wire connected to the first semiconductor element and the third semiconductor element; and a second wire connected to the second semiconductor element and the third semiconductor element, the second wire including an inclined portion configured to come closer to the second semiconductor element in the thickness direction as proceeding from the third semiconductor element toward the second semiconductor element, the inclined portion crossing the seal ring part as viewed in the thickness direction, wherein the first semiconductor element is supported by the first lead and the second semiconductor element is supported by the second lead, the method comprising a design step including:

a first design process of determining a distance d1 (mm) between the first lead and the second lead in the first direction to be greater than a distance d0=0.0294 mm; and a design process of determining a distance d3 between the inclined portion of the second wire and the seal ring part of the third semiconductor element in the thickness direction to be greater than the distance d0.

10. The method according to claim 9, wherein the first design process determines the distance d1 to be 10 mm or less.

11. The method according to claim 9, wherein the design step includes a second design process of determining a distance d2 between the first wire and the second wire to be greater than the distance d0.

12. The method according to claim 11, wherein the second design process determines the distance d2 to be 10 mm or less.

13. The method according to claim 11, wherein in the semiconductor device, the third semiconductor element is supported by the first lead.

14. The method according to claim 13, wherein the distance d3 is 10 mm or less.

15. The method according to claim 11, wherein in the semiconductor device, the third semiconductor element is supported by the second lead, and the design step includes another design process of determining a distance d4 between the first wire and the third semiconductor element to be greater than the distance d0.

16. The method according to claim 15, wherein the distance d4 is 10 mm or less.

17. A method for manufacturing a semiconductor device, comprising the method for designing a semiconductor device, according to claim 9.

* * * * *